(12) United States Patent
Kau et al.

(10) Patent No.: US 10,304,534 B2
(45) Date of Patent: May 28, 2019

(54) APPARATUSES AND METHODS INCLUDING MEMORY ACCESS IN CROSS POINT MEMORY

(71) Applicant: Micron Technology, Inc., Boise, ID (US)

(72) Inventors: DerChang Kau, Cupertino, CA (US); Gianpaolo Spadini, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/198,347

(22) Filed: Nov. 21, 2018

(65) Prior Publication Data
US 2019/0096484 A1 Mar. 28, 2019

Related U.S. Application Data

(60) Continuation of application No. 16/111,746, filed on Aug. 24, 2018, now Pat. No. 10,163,507, which is a
(Continued)

(51) Int. Cl.
*G11C 11/00* (2006.01)
*G11C 13/00* (2006.01)
(Continued)

(52) U.S. Cl.
CPC ........ *G11C 13/0069* (2013.01); *G11C 13/004* (2013.01); *G11C 13/0004* (2013.01); *G11C 13/0023* (2013.01); *G11C 13/0026* (2013.01); *G11C 13/0028* (2013.01); *G11C 13/0097* (2013.01); *G11C 16/08* (2013.01); *G11C 16/24* (2013.01); *H01L 23/528* (2013.01); *H01L 27/2427* (2013.01); *H01L 27/2463* (2013.01); *H01L 45/06* (2013.01); *H01L 45/1233* (2013.01); *H01L 45/141* (2013.01); *H01L 45/144* (2013.01); *H01L 2924/0002* (2013.01)

(58) Field of Classification Search
CPC .................................................. G11C 11/00
USPC ... 365/46, 94, 100, 113, 129, 148, 158, 163; 257/2–5, 9, 296, 310, 379, 467, E21.35, 257/E31.047, E27.006; 438/29, 95, 96, 438/166, 135, 240, 259, 365, 382, 482, 438/486, 597; 977/754
See application file for complete search history.

(56) References Cited

U.S. PATENT DOCUMENTS

| | | |
|---|---|---|
| 5,796,650 A | 8/1998 | Wik et al. |
| 6,335,896 B1 | 1/2002 | Wahlstrom |

(Continued)

OTHER PUBLICATIONS

"U.S. Appl. No. 13/465,579, Advisory Action dated Aug. 3, 2015", 3 pgs.
(Continued)

*Primary Examiner* — Harry W Byrne
(74) *Attorney, Agent, or Firm* — Schwegman Lundberg & Woessner, P.A.

(57) ABSTRACT

Some embodiments include apparatuses and methods having a memory cell, first and second conductive lines configured to access the memory cell, and a switch configured to apply a signal to one of the first and second conductive lines. In at least one of such embodiments, the switch can include a phase change material. Other embodiments including additional apparatuses and methods are described.

20 Claims, 17 Drawing Sheets

Related U.S. Application Data division of application No. 15/905,317, filed on Feb. 26, 2018, now Pat. No. 10,090,050, which is a division of application No. 15/676,560, filed on Aug. 14, 2017, now Pat. No. 9,905,296, which is a division of application No. 15/437,141, filed on Feb. 20, 2017, now Pat. No. 9,734,907, which is a division of application No. 15/180,909, filed on Jun. 13, 2016, now Pat. No. 9,576,659, which is a division of application No. 14/973,446, filed on Dec. 17, 2015, now Pat. No. 9,368,554, which is a division of application No. 13/465,579, filed on May 7, 2012, now Pat. No. 9,245,926.

(51) Int. Cl.
| | |
|---|---|
| H01L 45/00 | (2006.01) |
| G11C 16/08 | (2006.01) |
| H01L 27/24 | (2006.01) |
| G11C 16/24 | (2006.01) |
| H01L 23/528 | (2006.01) |

(56) References Cited

U.S. PATENT DOCUMENTS

| | | | |
|---|---|---|---|
| 6,795,338 B2* | 9/2004 | Parkinson et al. | 365/163 |
| 6,898,114 B2 | 5/2005 | Hidaka | |
| 6,990,017 B1* | 1/2006 | Parkinson et al. | 365/185.05 |
| 7,050,328 B2 | 5/2006 | Khouri et al. | |
| 7,391,664 B2 | 6/2008 | Parkinson | |
| 7,577,041 B2 | 8/2009 | Ueda | |
| 7,589,343 B2* | 9/2009 | Lowrey | 257/4 |
| 7,646,630 B2* | 1/2010 | Lowrey et al. | 365/163 |
| 7,859,895 B2 | 12/2010 | Lowrey | |
| 7,881,102 B2 | 2/2011 | Nitta et al. | |
| 7,969,798 B2 | 6/2011 | Hwang et al. | |
| 8,102,729 B2 | 1/2012 | Lee et al. | |
| 8,351,250 B2* | 1/2013 | Lowrey | 365/163 |
| 8,675,423 B2 | 3/2014 | Dodge | |
| 9,064,566 B2 | 6/2015 | Dodge | |
| 9,245,926 B2 | 1/2016 | Kau et al. | |
| 9,368,554 B2 | 6/2016 | Kau et al. | |
| 9,508,427 B2 | 11/2016 | Dodge | |
| 9,576,659 B2 | 2/2017 | Kau et al. | |
| 9,734,907 B2 | 8/2017 | Kau et al. | |
| 9,905,296 B2 | 2/2018 | Kau | |
| 10,090,050 B2 | 10/2018 | Kau et al. | |
| 2008/0130390 A1 | 6/2008 | Nakai et al. | |
| 2009/0073753 A1 | 3/2009 | Osada et al. | |
| 2009/0310402 A1 | 12/2009 | Parkinson | |
| 2009/0323397 A1 | 12/2009 | Kinoshita | |
| 2010/0157647 A1 | 6/2010 | Rinderson et al. | |
| 2010/0232205 A1* | 9/2010 | Parkinson | 365/148 |
| 2011/0204314 A1 | 8/2011 | Baek et al. | |
| 2012/0099364 A1 | 4/2012 | Park et al. | |
| 2013/0170279 A9 | 7/2013 | Huang et al. | |
| 2013/0294152 A1 | 11/2013 | Kau et al. | |
| 2013/0294153 A1 | 11/2013 | Dodge | |
| 2014/0211543 A1 | 7/2014 | Dodge | |
| 2015/0287457 A1 | 10/2015 | Dodge et al. | |
| 2016/0104747 A1 | 4/2016 | Kau et al. | |
| 2016/0293254 A1 | 10/2016 | Kau et al. | |
| 2017/0162263 A1 | 6/2017 | Kau et al. | |
| 2017/0345498 A1 | 11/2017 | Kau et al. | |
| 2018/0182457 A1 | 6/2018 | Kau et al. | |

OTHER PUBLICATIONS

"U.S. Appl. No. 13/465,579, Final Office Action dated Apr. 21, 2015", 8 pgs.

"U.S. Appl. No. 13/465,579, Non Final Office Action dated Jan. 2, 2015", 9 pgs.

"U.S. Appl. No. 13/465,579, Notice of Allowance dated Sep. 16, 2015", 8 pgs.

"U.S. Appl. No. 13/465,579, Response filed Mar. 31, 2015 to Non Final Office Action dated Jan. 2, 2015", 19 pgs.

"U.S. Appl. No. 13/465,579, Response filed Jul. 21, 2015 to Final Office Action dated Apr. 21, 2015", 17 pgs.

"U.S. Appl. No. 13/465,579, Response filed Oct. 15, 2014 to Restriction Requirement dated Aug. 15, 2014", 15 pgs.

"U.S. Appl. No. 13/465,579, Restriction Requirement dated Aug. 15, 2014", 7 pgs.

"U.S. Appl. No. 13/465,632, Notice of Allowance dated Oct. 28, 2013", 11 pgs.

"U.S. Appl. No. 14/216,115, Non Final Office Action dated Sep. 11, 2014", 5 pgs.

"U.S. Appl. No. 14/216,115, Notice of Allowance dated Feb. 20, 2015", 7 pgs.

"U.S. Appl. No. 14/216,115, Response filed Jan. 12, 2015 to Non Final Office Action dated Sep. 11, 2014", 8 pgs.

"U.S. Appl. No. 14/746,460, Non Final Office Action dated Mar. 7, 2016", 7 pgs.

"U.S. Appl. No. 14/746,460, Notice of Allowance dated Jul. 29, 2016", 7 pgs.

"U.S. Appl. No. 14/746,460, Preliminary Amendment filed Aug. 4, 2015", 7 pgs.

"U.S. Appl. No. 14/746,460, Response filed Jun. 7, 2016 to Non Final Office Action dated Mar. 7, 2016", 9 pgs.

"U.S. Appl. No. 14/973,446, Notice of Allowability dated May 12, 2016", 2 pgs.

"U.S. Appl. No. 14/973,446, Notice of Allowance dated Feb. 2, 2016", 10 pgs.

"U.S. Appl. No. 15/180,909, Notice of Allowance dated Oct. 7, 2016", 8 pgs.

"U.S. Appl. No. 15/437,141, Notice of Allowance dated Apr. 7, 2017", 8 pgs.

"U.S. Appl. No. 15/676,560, Notice of Allowance dated Oct. 12, 2017", 8 pgs.

"U.S. Appl. No. 15/905,317, Notice of Allowance dated May 18, 2018", 8 pgs.

"U.S. Appl. No. 16/111,746, Notice of Allowance dated Oct. 11, 2018", 8 pgs.

\* cited by examiner

200

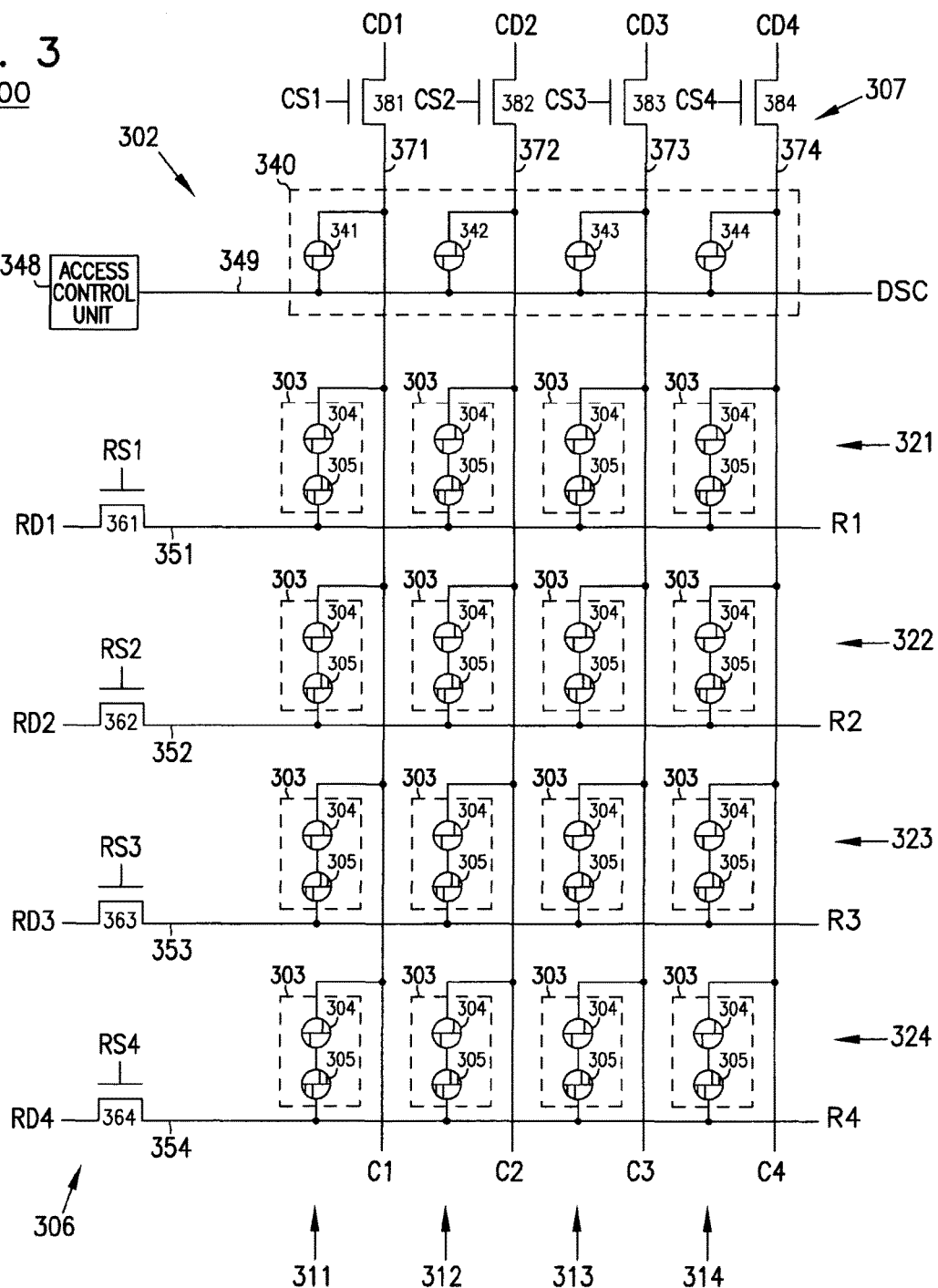

700

900

1000

1200

1300

1400

US 10,304,534 B2

APPARATUSES AND METHODS INCLUDING MEMORY ACCESS IN CROSS POINT MEMORY

PRIORITY

This application is a Continuation of U.S. patent application Ser. No. 16/111,746, filed Aug. 24, 2018, which is a Divisional of U.S. application Ser. No. 15/905,317, filed Feb. 26, 2018, now issued as U.S. Pat. No. 10,090,050, which is a Divisional of U.S. application Ser. No. 15/676,560, filed Aug. 14, 2017, now issued as U.S. Pat. No. 9,905,296, which is a Divisional of U.S. application Ser. No. 15/437,141, filed Feb. 20, 2017, now issued as U.S. Pat. No. 9,734,907, which is a Divisional of U.S. application Ser. No. 15/180,909, filed Jun. 13, 2016, now issued as U.S. Pat. No. 9,576,659, which is a Divisional of U.S. application Ser. No. 14/973,446, filed Dec. 17, 2015, now issued as U.S. Pat. No. 9,368,554, which is a Divisional of U.S. application Ser. No. 13/465,579, filed May 7, 2012, now issued as U.S. Pat. No. 9,245,926, all of which are incorporated herein by reference in their entirety.

BACKGROUND

Computers and other electronic products, for example, digital televisions, digital cameras, and cellular phones, often have one or more memory devices to store information. Such memory devices usually have numerous memory cells and associated circuitry to access the memory cells. As memory cell density increases for a given device size, producing these types of memory devices may pose challenges.

BRIEF DESCRIPTION OF THE DRAWINGS

FIG. 3 shows a schematic diagram of a portion of a memory device including a column switching circuit, according to an embodiment of the invention.

DETAILED DESCRIPTION

Figure 1:
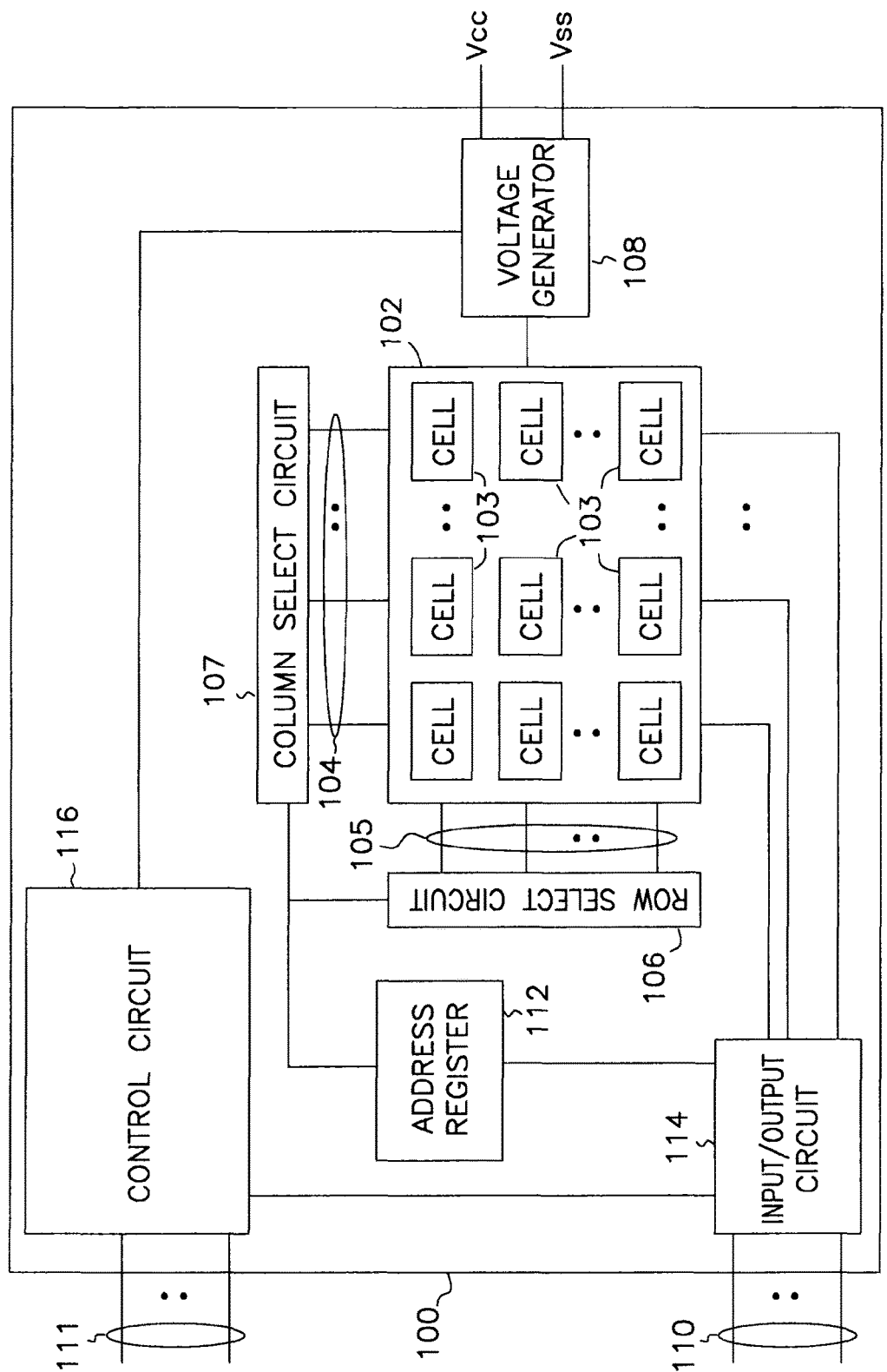
FIG. 1 shows a block diagram of an apparatus in the form of a memory device, according to an embodiment of the invention.

FIG. 1 shows a block diagram of an apparatus in the form of a memory device 100, according to an embodiment of the invention. A memory device, such as memory device, can includes any device having some memory capability, such as, but not limited to, stand alone memories, managed memories, processors and/or CPUs and/or logic circuits with embedded memory, sensors and/or other devices using code and/or data and/or parameter storage.

As shown in FIG. 1, memory device 100 can include a memory array 102 having memory cells 103 that can be arranged in rows and columns along with lines 104 and lines 105. Memory device 100 can include a row decoder 106 and a column decoder 107 coupled to memory cells 103 through lines 104 and lines 105, respectively.

Row and column decoders 106 and 107 can be configured to respond to an address register 112 to access memory cells 103 based on row address and column address signals on lines 110, 111, or both. A data input/output circuit 114 can be configured to exchange data between memory cells 103 and lines 110. Lines 110 and 111 can include nodes within memory device 100 (or alternatively, pins, solder balls, or other interconnect technologies such as controlled collapse chip connection (C4) or flip chip attach (FCA)) on a package where the memory device 100 can reside.

A control circuit 116 can control operations of memory device 100 based on signals present on lines 110 and 111. A device (e.g., a processor or a memory controller, not shown in FIG. 1) external to memory device 100 can send different commands (e.g., read, write, or erase command) to memory device 100 using different combinations of signals on lines 110, 111, or both.

Memory device 100 be configured to respond to commands to perform memory operations, such as a read operation to read information from memory cells 103 and a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a voltage generator 108. Control circuit 116 and voltage generator 108 can be configured to generate different voltages for use during memory operations of memory device 100. For example, voltages generated by voltage generator 108 can be applied (e.g., in the form of signals) to lines 104 and 105 during a read or write operation to access memory cells 103. Voltage generator 108 and control circuit 116 (or parts thereof) can be referred to separately or together as a module to cause the application of voltages to components (e.g., lines 104 and 105) of memory device 100.

Each of memory cells 103 can be programmed to store information representing a value for a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" for two bits, or one of eight possible values "000", "001", "010", "011", "100", "101", "110", and "111" for three bits, or one of other values for another number of multiple bits. A memory cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a variable resistance memory device (e.g., a phase change memory (PCM) device or a resistive random access memory (RRAM) device), or another kind of memory device, such as a flash memory device (e.g., a NAND flash or a NOR flash memory device).

In memory device 100, each of memory cells 103 can include a material. At least a portion of the material can be programmed to change between different states. The different states can have different resistance values. Such resistance values can be configured to represent different values of information stored in each of memory cells 103.

Memory device 100 can include a memory device where memory cells 103 can be physically located in multiple levels on the same device. For example, some of memory cells 103 can be stacked over some other memory cells 103 in multiple levels over a substrate (e.g., a semiconductor substrate) of memory device 100.

One of ordinary skill in the art may recognize that memory device 100 can include other elements. FIG. 1 omits such elements so as not to obscure some example embodiments described herein.

Memory device 100 may include memory devices and operate using memory operations similar to or identical to memory devices and operations described below with reference to FIG. 2A through FIG. 16.

Figure 2A:
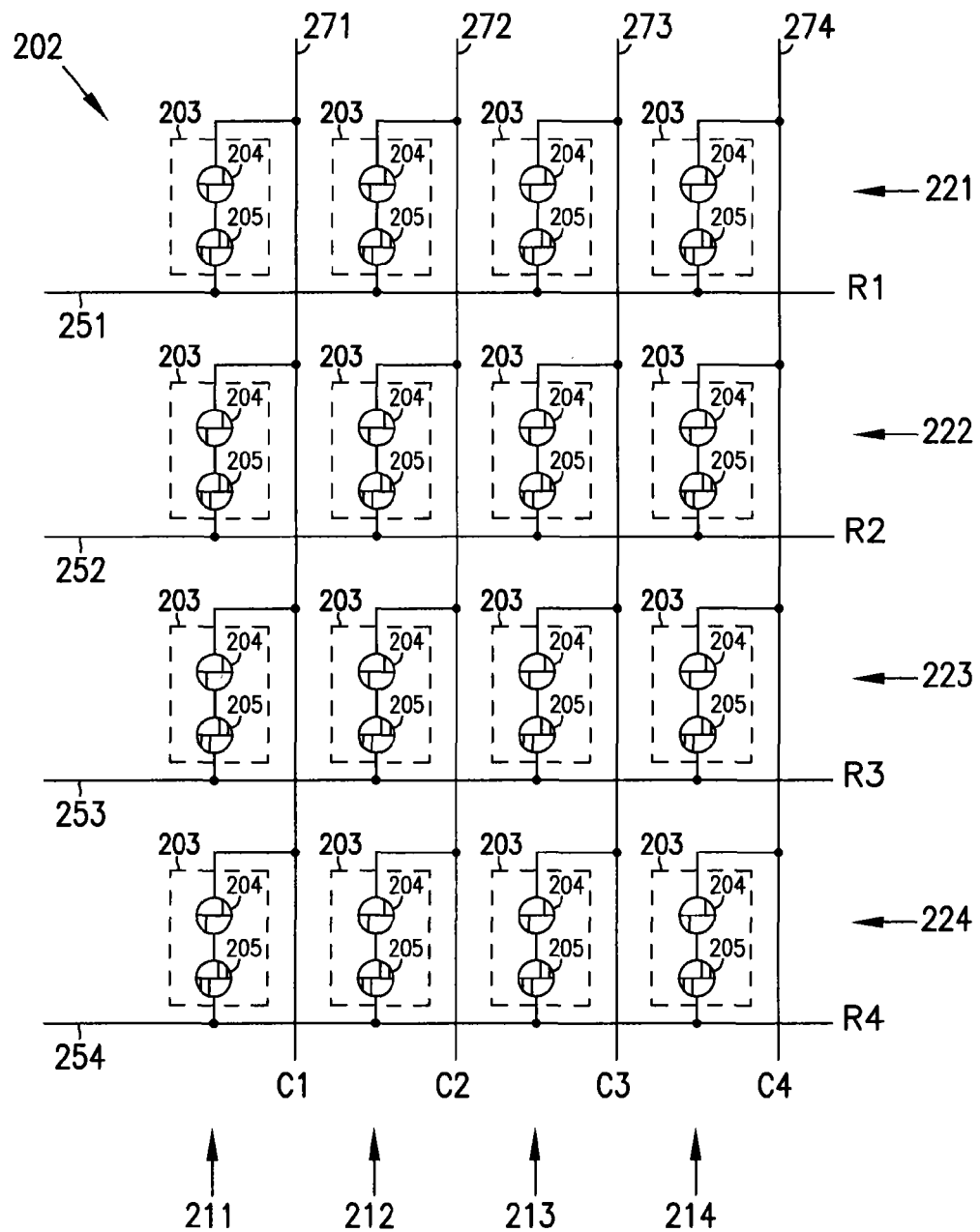
FIG. 2A shows a schematic diagram of a portion of a memory device having a memory array, according to an embodiment of the invention.

FIG. 2A shows a schematic diagram of a portion of a memory device 200 having a memory array 202, according to an example embodiment. Memory device 200 can be associated with memory device 100 of FIG. 1. For example, memory array 202 of FIG. 2A can form a portion of memory array 102 of memory device 100 of FIG. 1.

As shown in FIG. 2A, memory array 202 can include memory cells 203 that can be arranged in a number of rows 221, 222, 223 and 224 and a number of columns 211, 212, 213 and 214. Each of memory cells 203 can be coupled between one of lines 251, 252, 253, and 254 and one of lines 271, 272, 273, and 274. FIG. 2A shows an example of four lines 251, 252, 253, and 254 and four lines 271, 272, 273, and 274 and associated 16 memory cells 203. The number of lines and memory cells can vary.

Lines 251, 252, 253, and 254 and lines 271, 272, 273, and 274 can be configured as access lines (e.g., column and row access lines) to access memory cells 203. Either lines 251, 252, 253, and 254 or lines 271, 272, 273, and 274 can also be configured (e.g., as data lines) to provide information read from memory cells or information to be stored into memory cells 203.

Physically, lines 251, 252, 253, and 254 and lines 271, 272, 273, and 274 can be structured as conductive lines where lines 251, 252, 253, and 254 can pass over (e.g., cross over and not directly couple to) lines 271, 272, 273, and 274 at a number of different cross points. Each of memory cells 203 can be located between and coupled to one of lines 251, 252, 253, and 254 and one of lines 271, 272, 273, and 274 at one of the cross points. Thus, memory array 202 can be, for example, a cross-point memory array. Memory cells 203 can be non-volatile memory cells.

As shown in FIG. 2A, each of memory cells 203 can include an access component 204 and a storage element 205. Storage element 205 can be configured to store information. For example, storage element 205 can be configured to store a value representing a value of a fraction of a bit, a single bit, or multiple bits. Access component 204 in each of memory cells 203 can be configured to operate as a switch to access storage element 205 in the same memory cell.

Storage element 205 can include a material where at least a portion of the material can be changed (e.g., in a write operation) between different states (e.g., different material phases). The different states can have a range of different resistance values. Different resistance values can be configured to represent different values of information stored in each of memory cells 203.

Access component 204 can include a material where at least a portion of the material can be configured to change (e.g., switch) between a non-conductive state and a conductive state. For example, when one of memory cells 203 is selected in a memory operation, memory device 200 can cause access component 204 of the selected memory cell 203 to turn on (e.g., change from a non-conductive state to a conductive state). This allows access to storage element 205 of the selected memory cell.

A memory operation in memory device 200 can include different stages. The stages can include an access stage followed by either a sense stage (e.g., read stage) or a program stage (e.g., write stage). In the access stage, memory device 200 can turn on access component 204 of a selected memory cell 203 to access storage element 205 of the selected memory cell. If the memory operation is a read operation, memory device 200 can perform an access stage followed by a sense stage to sense information from the selected memory cell. Based on sensed information, memory device 200 can determine the value of information stored in the selected memory cell. If the memory operation is a write operation, memory device 200 can perform an access stage followed by a program stage to store information into the selected memory cell.

Storing information into storage element 205 of a selected memory cell (one of memory cells 203) in a write operation can include causing storage element 205 of the selected memory cell 203 to have a specific resistance value. The specific resistance value can be configured to represent the value of information to be stored into the selected memory cell. Thus, sensing information from a selected memory cell (e.g., in a read operation) can include measuring a resistance value of storage element 205 of the selected memory cell. Measuring the resistance value can include determining a value of a signal (e.g., an electrical current signal) going through the selected memory cell. Based on a measured value of the signal, a corresponding value of the information stored in the selected memory cell can be determined.

As described above, in a memory operation, one of memory cells 203 can be the selected memory cell and accessed to read information from or to store information into the selected memory cell. In a memory operation, the selected memory cell can be associated with two selected lines (e.g., selected row and column access lines). One selected line can be from one of lines 251, 252, 253, and 254. The other selected line can be from one of lines 271, 272, 273, and 274. To access a selected memory cell, memory device 200 can turn on access component 204 of the selected memory cell based on a voltage difference between the two selected lines.

In FIG. 2A, depending on which of memory cells 203 is a selected memory cell in a memory operation, memory device 200 can apply different voltages to lines 251, 252, 253, and 254 and lines 271, 272, 273, and 274. The different voltages can have different values to turn on access component 204 of only the selected memory cell. This allows access to only the selected memory cell. Access component 204 of memory cells 203 that are unselected (in other words, not selected) can turn off (e.g., remain in a non-conductive state). Thus, memory cells 203 that are unselected in the memory operation are not accessed.

In the following example memory operation, memory cell 203 located at the cross point of row 224 and column 214 is assumed to be a selected memory cell. Other memory cells 203 can be referred to as unselected memory cells. Two lines that are directly coupled to a selected memory cell can be referred to as selected lines. Thus, in this example, lines 254 and lines 274 can be referred to as selected lines. Lines that are not directly coupled to the selected memory cell can be referred to as unselected lines. Thus, in this example, lines 251, 252, 253, 271, 272, and 273 can be referred to as unselected lines.

In the example memory operation, memory device 200 can apply different voltages to lines 254 and 274 (e.g., two selected lines). The voltages on lines 254 and 274 can have values, such that a voltage difference between lines 254 and 274 can cause access component 204 of the selected memory cell to turn on. This allows access to storage element 205 of the selected memory cell. Memory device 200 can either read information from or store information into the selected memory cell after it is accessed. Memory device 200 can read information from the selected memory cell if the example memory operation is a read operation. Memory device 200 can store information into the selected memory cell if the example memory operation is a write operation.

In the above example memory operation, memory device 200 can also apply voltages to the unselected lines (lines 251, 252, 253, 271, 272, and 273). However, the voltages applied to the unselected lines can have values, such that a voltage difference between each of lines 251, 252, and 253 and each of lines 271, 272, and 273 can be insufficient to turn on access component 204 of the unselected memory cells coupled to the unselected lines (e.g., memory cells at intersections of columns 211, 212, and 213 and rows 221, 222, and 223). Voltages applied to the unselected lines can have values, such that a voltage difference between line 274 and each of lines 251, 252, and 253 and a voltage difference between line 254 and each of lines 271, 272, and 273 can be insufficient to turn on access component 204 of the unselected memory cells coupled to the selected lines (e.g., memory cells at intersections of columns 211, 212, and 213 and rows 224 and memory cells at intersections of rows 221, 222, and 223 and column 214). Thus, unselected memory cells 203 are not accessed.

Storage element 205 can include a variable resistance material. For example, storage element 205 can include a phase change material. An example of a phase change material includes a chalcogenide material. Examples of chalcogenide materials include various combinations of germanium (Ge), antimony (Sb), tellurium (Te), and other similar materials.

A phase change material can be configured to change between a crystalline state (sometimes referred to as crystalline phase) and an amorphous state (sometimes referred to as amorphous phase). The phase change material can have one resistance value when it is in the crystalline state and another resistance value when it is in the amorphous state. These different resistance values of the phase change material can be configured to represent different values of information stored in a storage element, such as storage element 205 of memory device 200.

Access component 204 can include a variable resistance material (e.g., phase change material). However, the material of access component 204 can be configured such that it can operate only as a switch (e.g., not to store information) to allow access to storage element 205, as described above. For example, access component 204 can include a phase change material that can be configured to operate as an ovonic threshold switch (OTS).

The ovonic threshold switch can have a threshold voltage (e.g., Vt) such that the ovonic threshold switch can switch from a non-conductive state (e.g., a highly resistive state) to a conductive state (a lower resistive state) when a voltage across it exceeds the threshold voltage. An amount of current can flow through the ovonic threshold switch when it is the conductive state. The amount of current can decrease after a time. When the amount of current reaches a specific value (e.g., a holding current value), the ovonic threshold switch can switch back to the non-conductive state. This switching of the ovonic threshold switch can also happen if the polarities of the voltages across the ovonic threshold switch are changed.

In FIG. 2A, when access component 204 is configured as an ovonic threshold switch, memory device 200 can cause a voltage difference between two selected lines coupled to a selected memory cell 203 to have value, such that the ovonic threshold switch formed by access component 204 of a selected memory cell 203 can switch from a non-conductive state to a conductive state. This allows access to the selected memory cell.

Figure 2B:
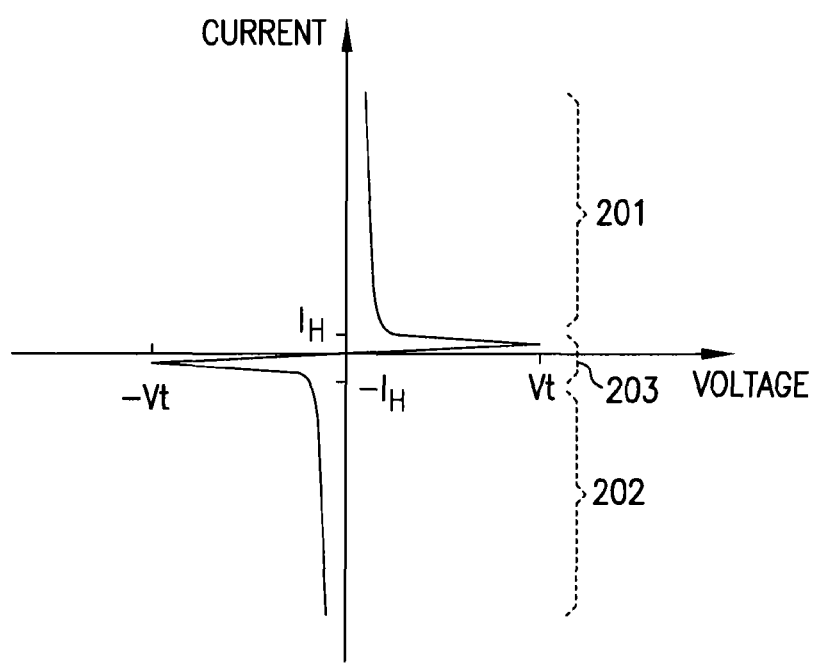
FIG. 2B is a graph showing an example of a current versus voltage (IV) curve of an access component in a memory cell of the memory device of FIG. 2A.

FIG. 2B is a graph showing an example of an IV curve of an access component 204 of FIG. 2A. The IV graph in FIG. 2B shows an example where access component 204 includes a phase change material configured to operate as an ovonic threshold switch. As shown in FIG. 2B, access component 204 can be in a conductive state in regions 201 and 202 and in a non-conductive state in region 203. "$I_H$" and "$-I_H$" can correspond to holding current values of access component 204 where access component 204 can switch between a conductive state and a non-conductive state. As shown in FIG. 2B, access component 204 can switch from a non-conductive state (e.g., region 203) to a conductive state (e.g., region 201) when a voltage across memory cell 203 (FIG. 2A) exceeds a threshold voltage (Vt) of the ovonic threshold switch formed in access component 204. In the conductive state (region 201), the value of current flowing through access component 204 can be greater than holding current value $I_H$. When the value of current flowing through access component 204 falls below holding current value $I_H$, access component 204 can switch from a conductive state (e.g., region 201) to a non-conductive state (e.g., region 203).

Similarly, as shown in FIG. 2B, access component 204 can switch between non-conductive state (e.g., region 203) and conductive state (e.g., region 202) depending on the value of voltage across memory cell 203 (FIG. 2) relative to that of threshold voltage (-Vt) and the value of current flowing through access component 204 relative to that of holding current value $-I_H$.

Memory device 200 of FIG. 2A can include memory devices and operate using memory operations similar to or identical to memory devices and operations described below with reference to FIG. 3 through FIG. 16.

FIG. 3 shows a schematic diagram of a portion of a memory device 300 including a switching circuit 340 (e.g., column switching circuit), according to an embodiment of the invention. Memory device 300 can be associated with memory device 100 of FIG. 1 or memory device 200 of FIG. 2A. For example, memory array 302 of FIG. 3 can form a portion of memory array 102 of memory device 100 of FIG. 1 or a portion of memory array 202 of memory device 200 of FIG. 2A.

As shown in FIG. 3, memory array 302 can include memory cells 303 arranged in rows 321, 322, 323, and 324 and columns 311, 312, 313, and 314. Memory device 300 can include lines 351, 352, 353, and 354, which can correspond to lines 251, 252, 253, and 254 of FIG. 2A. Memory device 300 can include lines 371, 372, 373, and 374. Lines 371, 372, 373, and 374 of FIG. 3 can correspond to lines 271, 272, 273, and 274 of FIG. 2A. FIG. 3 shows an example of four lines 351, 352, 353, and 354 and four lines 371, 372, 373, and 374 and 16 memory cells 303. The number of lines and memory cells can vary.

Each of memory cells 303 can include an access component 304 and a storage element 305. Memory cells 303 can be configured to operate as memory cells 203 of FIG. 2A. For example, storage element 305 can be configured to store information. Access component 304 can be configured to access storage element 305. Access component 304 and storage element 305 in FIG. 3 can include materials (e.g., phase change materials) similar to or identical to those of access component 204 and storage element 205, respectively, of FIG. 2A.

Memory device 300 can include select circuits 306 and 307 that can be configured to access memory cells 303 during a memory operation. Select circuits 306 and 307 can be part of row and column decoders (such as row and column decoders 106 and 107 of FIG. 1) of memory device 300.

Select circuit 306 can include transistors 361, 362, 363, and 364, which can be configured to turn on or off based on corresponding signals RS1, RS2, RS3, and RS4. Transistors 361, 362, 363, and 364, when turned on, can couple lines 351, 352, 353, and 354 to signals RD1, RD2, RD3, and RD4, respectively. Lines 351, 352, 353, and 354 can carry signals R1, R2, R3, and R4. The values (e.g., voltage values) of signals R1, R2, R3, and R4 can be based on the values of signals RD1, RD2, RD3, and RD4, respectively, when transistors 361, 362, 363, and 364 turn on.

Select circuit 307 can include transistors 381, 382, 383, and 384, which can be configured to turn on or off based on corresponding signals CS1, CS2, CS3, and CS4. Transistors 381, 382, 383, and 384, when turned on, can couple lines 371, 372, 373, and 374 to signals CD1, CD2, CD3, and CD4, respectively. Lines 371, 372, 373, and 374 can carry signals C1, C2, C3, and C4. The values (e.g., voltage values) of signals C1, C2, C3, and C4 can be based on the values of signals CD1, CD2, CD3, and CD4, respectively, when transistors 381, 382, 383, and 384 turn on.

Switching circuit 340 can include switches 341, 342, 343, and 344. Each of switches 341, 342, 343, and 344 can be configured to turn on and couple a corresponding line 371, 372, 373, or 374 to a line 349 during a memory operation. An access control unit 348 can be configured to provide line 349 with a voltage in the form of a signal DSC. A material of switches 341, 342, 343, and 344 can be similar to or identical to those of access component 304. For example, each of switches 341, 342, 343, and 344 can include a variable resistance material (e.g., a phase change material). Switches 341, 342, 343, and 344 can be configured to operate as ovonic threshold switches.

In a memory operation, one of lines 371, 372, 373, and 374 can be a selected line (e.g., selected column access line) to access a selected memory cell. One of lines 351, 352, 353, and 354 can also be a selected line (e.g., selected row access line). The selected line among lines 371, 372, 373, and 374 can be coupled to line 349 in a memory operation through one of switches 341, 342, 343, and 344 that turns on. Thus, in a memory operation, the voltage on the selected line among lines 371, 372, 373, and 374 can have value based on the value of the voltage on line 349. Line 349 can be provided with a voltage such that a voltage difference between the selected line among lines 371, 372, 373, and 374 and the selected line among lines 351, 352, 353 and 354 can turn on access component 304 of the selected memory cell.

In the following example memory operation, memory cell 303 located at cross point of row 324 and column 314 is assumed to be a selected memory cell. Other memory cells 303 can be referred to as unselected memory cells. In this example, lines 354 and lines 374 can be referred to as selected lines. Lines 351, 352, 353, 371, 372, and 373 can be referred to as unselected lines.

In the example memory operation, memory device 300 can turn on switch 344. Switches 341, 342, and 343 can be turned off. Since switch 344 is turned on, line 374 is coupled to line 349 through switch 344. Thus, the voltage on line 374 can have a value based on the value of the voltage on line 349. Memory device 300 can also apply a voltage on line 354. The voltages on lines 354 and 349 can have values, such that their voltage difference can cause access component 304 of the selected memory cell to turn on. This allows access to storage element 305 of the selected memory cell.

In the above example, memory device 300 can also apply voltages to the unselected lines (lines 351, 352, 353, 371, 372, and 373). The values of the voltages applied to the unselected lines can have a value, such that a voltage difference between each of lines 351, 352, and 353 and each of lines 371, 372, and 373 are insufficient to turn on access component 304 of the unselected memory cells. Voltages applied to the unselected lines can have values, such that a voltage difference between line 374 and each of lines 351, 352, and 353 and a voltage difference between line 354 and each of lines 371, 372, and 373 can be insufficient to turn on access component 304 of the unselected memory cells coupled to the selected lines (e.g., memory cells at intersections of columns 311, 312, and 313 and rows 324 and memory cells at intersections of rows 321, 322, and 323 and column 314). Thus, unselected memory cells 303 are not accessed.

Figure 4:
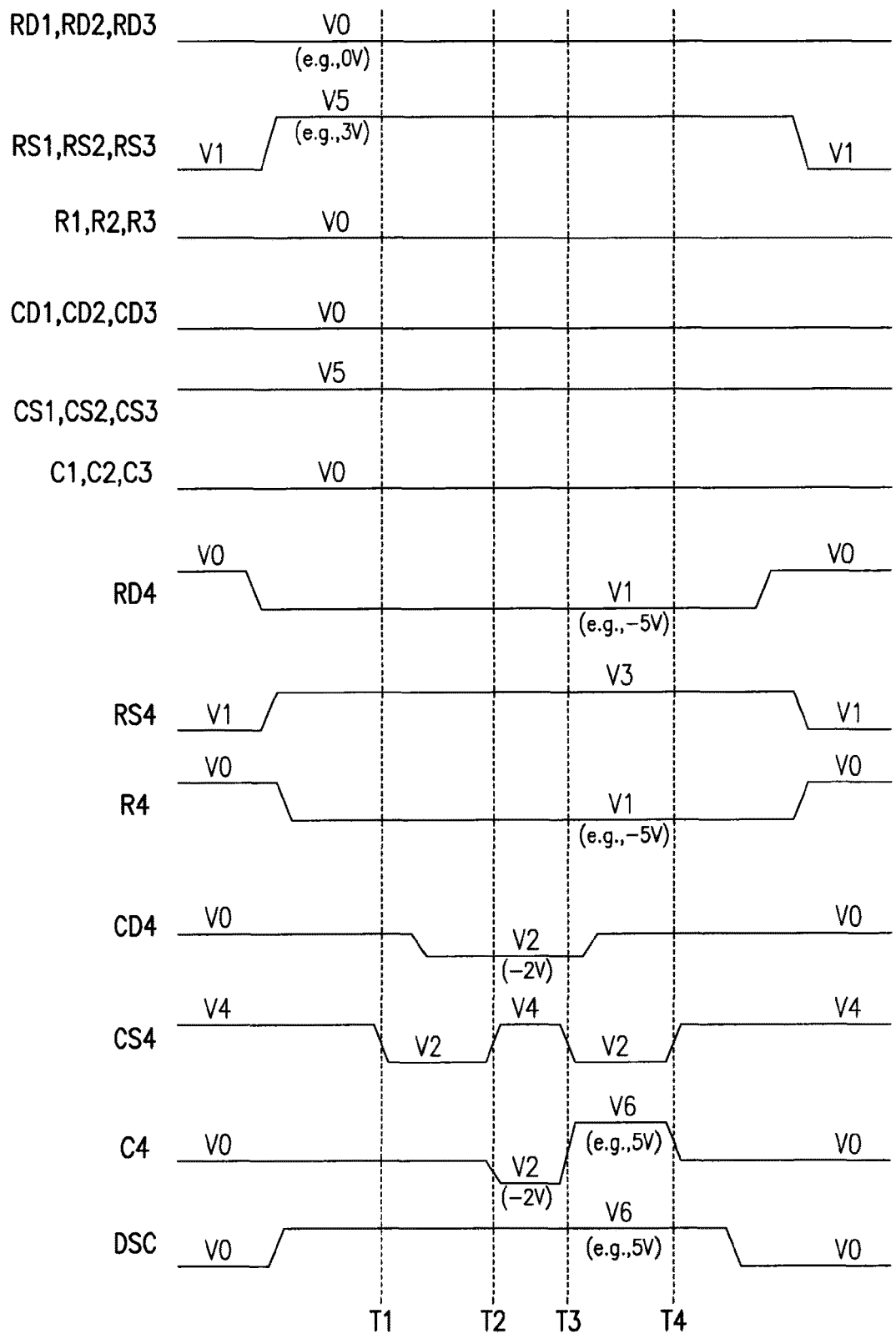
FIG. 4 is an example timing diagram for signals shown in FIG. 3 during a memory operation, according to an embodiment of the invention.

FIG. 4 is an example timing diagram for the signals shown in FIG. 3 during a memory operation, according to an embodiment of the invention. In FIG. 4, T1 through T4 represent different times (e.g., during an access stage) in the example memory operation. V0, V1, V2, V3, V4, V5, and V6 represent different voltages. The waveforms associated with the signals shown in FIG. 4 are not scaled. The following description below with reference to FIG. 3 and FIG. 4 assumes that memory cell 303 at the cross point of row 324 and column 314 (FIG. 3) is a selected memory cell.

In FIG. 4, a time interval between times T3 and T4 in FIG. 4 can be a time interval where the selected memory cell is accessed. If the memory operation is a read operation, as described above with reference to FIG. 3 and FIG. 4, memory device 300 can perform a sense stage after the access stage (e.g., after time T4) to sense information from the selected memory cell. If the memory operation is a write operation, as described above with reference to FIG. 3 and FIG. 4, memory device 300 can perform a program stage after the access stage (e.g., after time T4) to store information in the selected memory cell.

In FIG. 4, a voltage difference between signal C4 on line 374 (e.g., selected column access line) and signal R4 on line 354 (e.g., selected row access line) can correspond to a voltage difference between voltages V6 and V1 on signals C4 and R4, respectively. Between times T3 and T4, voltage V6 of signal C4 can be based on voltage V6 of signal DSC. Voltage V1 of signal R4 can be based on voltage V1 of signal DR4. Memory device 300 can be configured to provide voltage V1 and V6 with voltage values, such that the voltage difference between voltages V6 and V1 (e.g., V6−V1) can turn on access component 304 of the of the selected memory cell 303. In this description, a reference to a first voltage (e.g., voltage associated with a signal on a first line, such as a conductive line) being based on a second voltage (e.g., voltage associated with a signal on a second line) means that the first voltage can be substantially equal to the second voltage. It can also means that the first and second voltages may have a small voltage difference between them due to, for example, a small voltage drop in the element (e.g., a switch or a transistor) between the two lines that respectively carry the first and second voltages. Here, for example, a reference of voltage V6 of signal C4 can be based on voltage V6 of signal DSC means that voltage V6 of signal C4 can be substantially equal to voltage V6 of signal DSC. It can also mean that a small voltage drop may occur in the element (e.g., switch 344) between line 374 that carries signal C4 and line 349 that carries signal DSC.

Voltages V1 and V6 can have the same polarity or opposite polarities. For example, voltage V1 can have a negative value and voltage V6 can have a positive value. As shown in FIG. 4, voltages V1 and V6 can have example values of −5 (minus five) and five volts, respectively. Thus, in this example, the voltage difference between signals C4 and R4 is V6−V1=5−(−5)=10 volts. Access component 304 can be configured to turn on with this voltage difference between voltages V6 and V1 (e.g., 10 volts).

Providing voltage V1 to signal R4 (between times T3 and T4) can include coupling line 354 to signal RD4. Transistor 364 can be turned on based on signal RS4 to couple line 354 to signal RD4. Memory device 300 can be configured to provide voltage V3 to signal RS4 with a voltage value to turn on transistor 364. For example, voltage V3 can have a value of approximately zero volts when voltage V1 has a negative value (e.g., −5 volts). Alternatively voltage V3 can have another value, such as positive value. For example, voltage V3 can have a value of approximately three volts.

Providing voltage V6 to signal C4 (between times T3 and T4) can include several activities. For example, between times T2 and T3, memory device 300 can turn on transistor 384 to couple line 374 to signal CD4 in order to cause signal C4 on line 374 to have a voltage (e.g., V2) based on voltage V2 provided to signal CD4. Switch 344 can be turned on between times T2 and T3. Memory device 300 can be configured to provide voltage V2 with a voltage value, such that a voltage difference between voltages V6 and V2 (e.g., V6−V2) can exceed the threshold voltage of switch 344 between times T2 and T3 to turn on switch 344. Memory device 300 can turn off transistor 384 (e.g., between times T3 and T4) to decouple line 374 from signal CD4 when switch 344 turns on. Thus, between times T3 and T4, line 374 is coupled to line 349 (associated with signal DSC). Therefore, as shown in FIG. 4, between times T3 and T4, signal C4 can be provided with voltage V6, which is based on voltage V6 provided to signal DSC.

Memory device 300 can provide different voltages (e.g., V2 and V4) to signal CS4 during different time intervals between times T1 and T4 in order to turn on or off transistor 384 during an access stage (e.g., between times T1 and T4) of the above example memory operation. For example, as shown in FIG. 4, signal CS4 can be provided with voltage V2 between times T1 and T2 and between times T3 and T4 and voltage V4 between times T2 and T3. Memory device 300 can be configured to provide voltage V4 to signal CS4 with a voltage value to turn on transistor 384. For example, voltage V4 can have a value of approximately zero volts when voltage V2 has a negative value (e.g., −2 volts). Alternatively voltage V4 can have another value, such as a positive value. For example, voltage V4 can have a value of approximately three volts.

Other signals in FIG. 4 can be provided with voltages (e.g., V0 and V5). For example, as shown in FIG. 4, signals R1, R2, R3, C1, C2, and C3 can be provided with a voltage (e.g., V0) based on voltage V0 from signals RD1, RD2, RD3, CD1, CD2, and CD3, respectively. This can be done by, for example, providing voltage V5 to signals RS1, RS2, RS3, CS1, CS2, and CS3 to turn on transistors 361, 362, 363, 381, 382, and 383 (FIG. 3).

Memory device 300 can be configured to provide voltage V5 with a voltage value to turn on transistors 361, 362, 363, 364, 381, 382, 383, and 384. Voltage V5 can have a positive value. For example, voltage V5 can have a value of approximately three volts.

Memory device 300 can be configured to provide voltage V0 with a voltage value such that switches 341, 342, and 343 (FIG. 3) and access component 304 of each of unselected memory cells 303 can remain in a non-conductive state (e.g., turned off). For example, voltage V0 can have a value of approximately zero volts.

The above description of the example memory operation assumes that memory cell 303 at the cross point of row 324 and column 314 is a selected memory cell. Similar operations can be applied to other memory cells among memory cells 303. For example, if memory cell 303 located at row 321 and column 311 is a selected memory cell during a memory operation, then only switch 341 can be turned on (e.g., between times T3 and T4) to couple line 371 to line 349. Other switches 342, 343, and 344 and access component 304 of unselected memory cells 303 can remain turned off. In this example, a voltage difference (e.g., V6-V1)

between lines 371 and 351 (selected lines) can turn on access component 304 of the selected memory cell 303 located at the cross point of row 321 and column 311.

After the access component (e.g. access component 304 of selected memory cell 303) is turned on, a sense stage or a program stage can be performed. For this purpose the appropriate sense or program voltage (or current) can be supplied to the selected cell through the switch coupled to the selected column access line.

Figure 5:
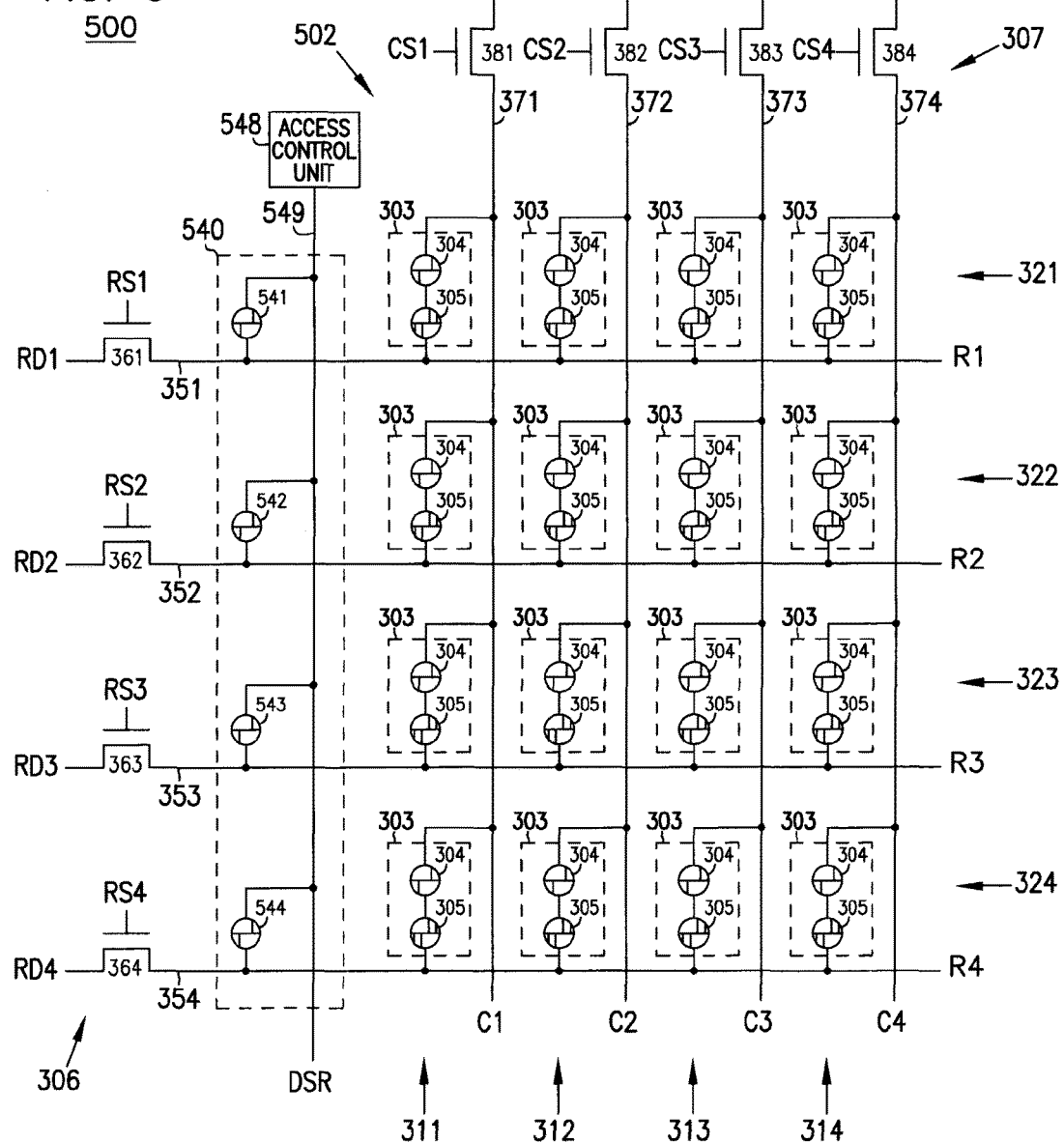
FIG. 5 shows a schematic diagram of a portion of a memory device including a row switching circuit, according to an embodiment of the invention.

FIG. 5 shows a schematic diagram of a portion of a memory device 500 including a switching circuit 540 (e.g., row switching circuit), according to an embodiment of the invention. Memory device 500 can include elements similar to or identical to those of memory device 300 of FIG. 3. Such elements are given the same designation labels. For simplicity, detailed description of similar or identical elements between FIG. 3 and FIG. 5 is not repeated in the description of FIG. 5. In FIG. 3, switching circuit 340 can be coupled to lines 371, 372, 373, and 374 associated with columns 311, 312, 313, and 314. Unlike FIG. 3, switching circuit 540 in FIG. 5 in memory device can be coupled to lines 351, 352, 353, and 354 associated with rows 321, 322, 323, and 324.

Switching circuit 540 can include switches 541, 542, 543, and 544. Each of switches 541, 542, 543, and 544 can be configured to turn on and couple a corresponding line 351, 352, 535 and 354 to a line 549 during a memory operation. An access control unit 548 can be configured to provide line 549 with a voltage in the form of a signal DSR.

In a memory operation, one of lines 371, 372, 373, and 374 can be a selected line (e.g., selected column access line) to access a selected memory cell. One of lines 351, 352, 353, and 354 can also be a selected line (e.g., selected row access line). The selected lines among lines 351, 352, 353, and 354 can be coupled to line 549 in a memory operation through one of switches 541, 542, 543, and 544 that turns on. Thus, in a memory operation, the voltage on the selected line among lines 351, 352, 353, and 354 can have value based on the value of the voltage on line 549. Line 549 can be provided with a voltage such that a voltage difference between the selected line among lines 351, 352, 353, and 354 and the selected line among lines 371, 372, 373, and 374 can turn on access component 304 of the selected memory cell.

In the following example memory operation, memory cell 303 located at cross point of row 324 and column 314 is assumed to be a selected memory cell. Other memory cells 303 can be referred to as unselected memory cells. In this example, lines 354 and lines 374 can be referred to as selected lines. Lines 351, 352, 353, 371, 372, and 373 can be referred to as unselected lines.

In the example memory operation, memory device 300 can turn on switch 544. Switches 541, 542, and 543 can be turned off. Since switch 544 is turned on, line 354 is coupled to line 549 through switch 544. Thus, the voltage on line 354 can have a value based on the value of the voltage on line 549. Memory device 300 can also apply a voltage on line 374. The voltages on lines 354 and 374 can have values, such that their voltage difference can cause access component 304 of the selected memory cell to turn on. This allows access to storage element 305 of the selected memory cell.

In the above example, memory device 300 can also apply voltages to the unselected lines (lines 351, 352, 353, 371, 372, and 373). The values of the voltages applied to the unselected lines can have a value, such that a voltage difference between each of lines 351, 352, and 353 and each of lines 371, 372, and 373 are insufficient to turn on access component 304 of the unselected memory cells. Voltages applied to the unselected lines can have values, such that a voltage difference between line 374 and each of lines 351, 352, and 353 and a voltage difference between line 354 and each of lines 371, 372, and 373 can be insufficient to turn on access component 304 of the unselected memory cells coupled to the selected lines (e.g., memory cells at intersections of columns 311, 312, and 313 and rows 324 and memory cells at intersections of rows 321, 322, and 323 and column 314). Thus, unselected memory cells 303 are not accessed.

Figure 6:
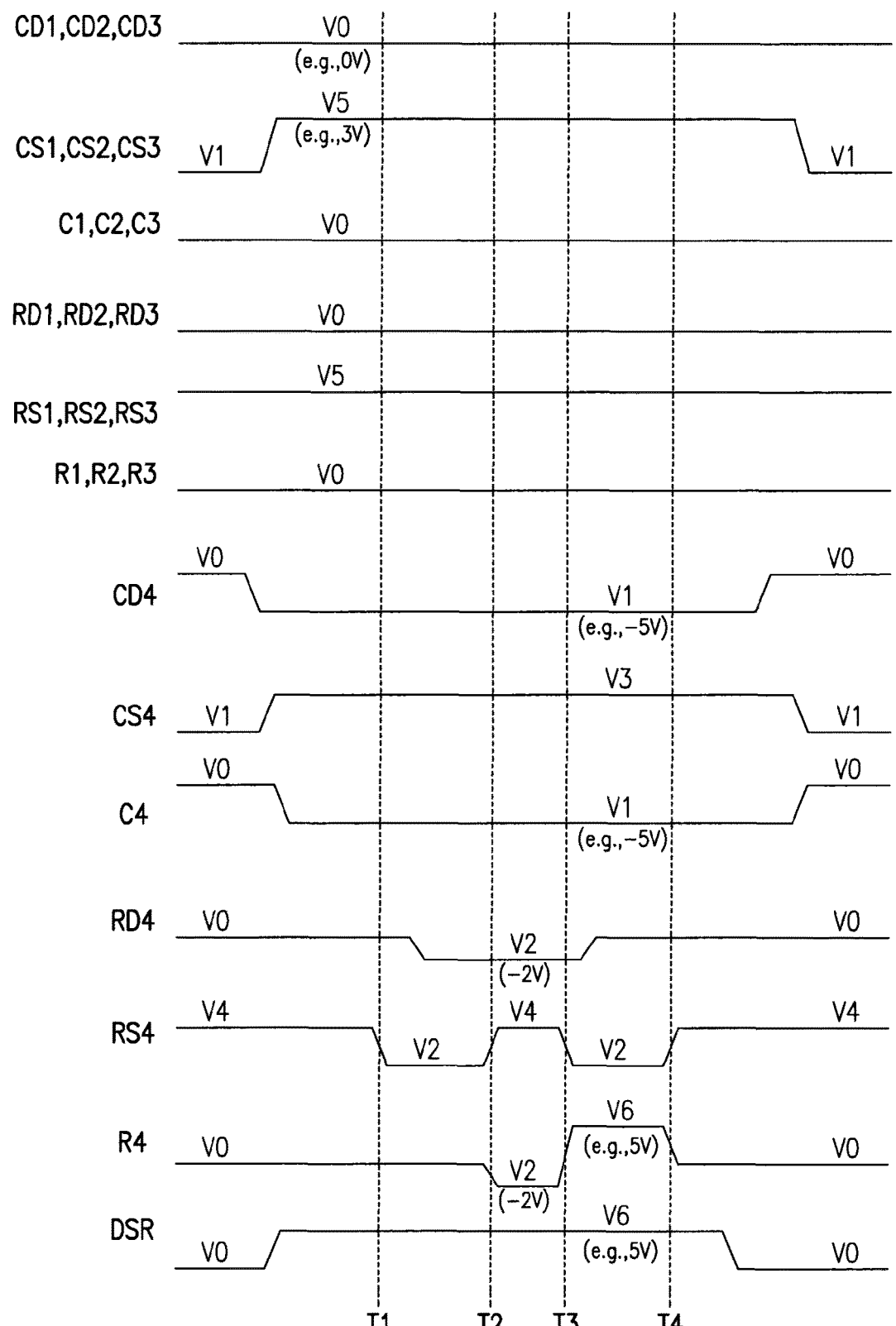
FIG. 6 is an example timing diagram for signals shown in FIG. 5 during a memory operation, according to an embodiment of the invention.

FIG. 6 is an example timing diagram for the signals shown in FIG. 5 during a memory operation, according to an embodiment of the invention. The following description with reference to FIG. 5 and FIG. 6 assumes that memory cell 303 at the cross point of row 324 and column 314 (FIG. 5) is a selected memory cell. Memory cell 303 typically has similar behavior for currents flowing in opposite directions but can have some asymmetry. Thus, the waveforms of the signals in FIG. 6 can be similar to or identical to those of FIG. 4, except that signals associated columns 311, 312, 313, and 314 and with DSC in FIG. 3 are exchanged with the signals associated with rows 321, 322, 323, and 324 and with DSR in FIG. 5 and, if the cell asymmetry is large, the voltage polarity of each signal should be reversed.

Figure 7:
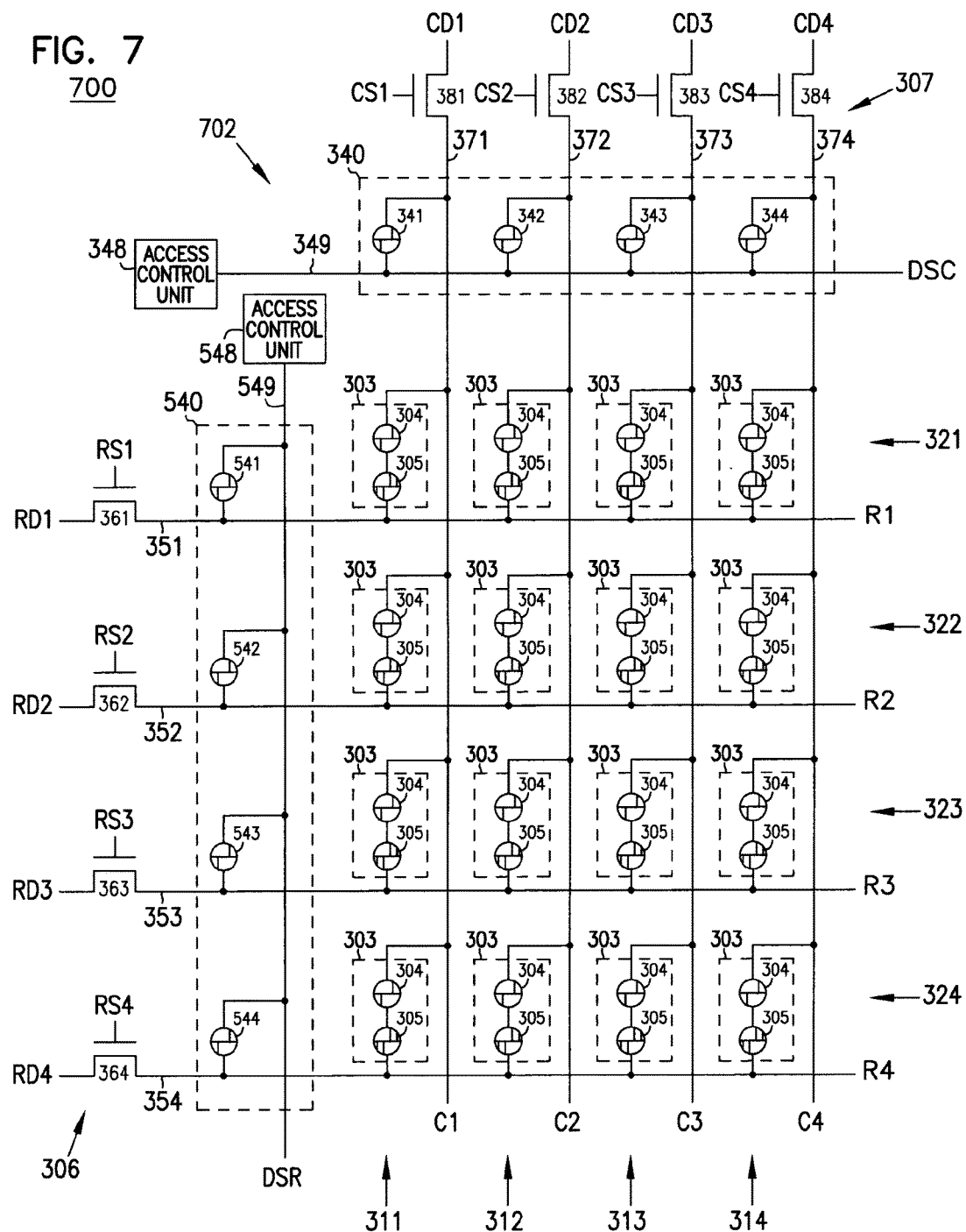
FIG. 7 shows a schematic diagram of a portion of a memory device including row and column switching circuits, according to an embodiment of the invention.

FIG. 7 shows a schematic diagram of a portion of a memory device 700 including switching circuits 340 and 540 (e.g., column and row switching circuits), according to an embodiment of the invention. Memory device 700 can include elements similar to or identical to those of memory device 300 of FIG. 3 and memory device 500 of FIG. 5. Such elements are given the same designation labels. For simplicity, detailed description of similar or identical elements among FIG. 3, FIG. 5, and FIG. 7 is not repeated in the description of FIG. 7. As shown in FIG. 7, memory device 700 can include a combination of both switching circuits 340 and 540. Thus, in a memory operation to access a selected memory cell (one of memory cells 303 in FIG. 7), a selected line among lines 371, 372, 373, and 374 can be coupled to line 349. A selected line among lines 351, 352, 353, and 354 can be coupled to line 549.

Figure 8:
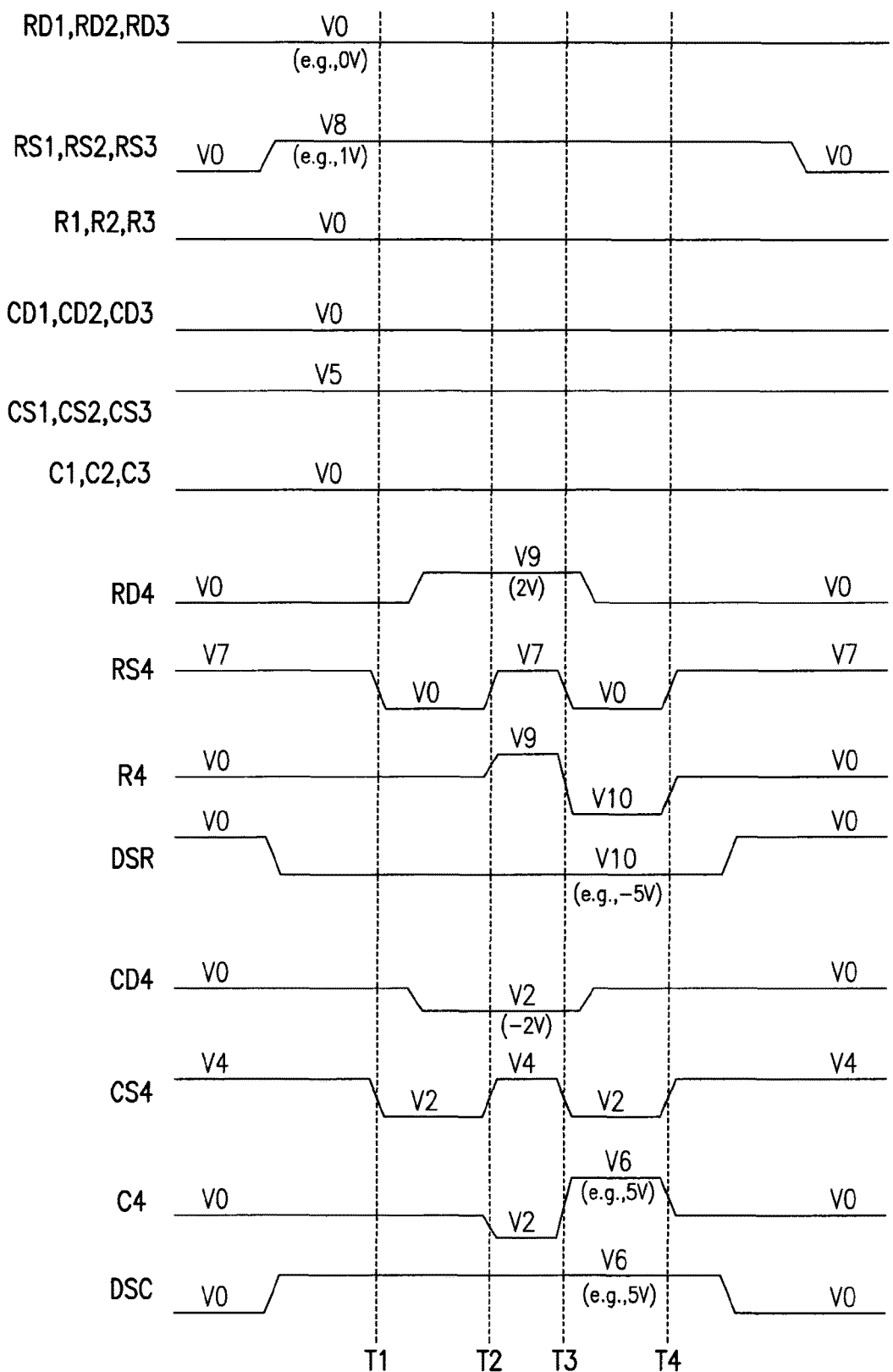
FIG. 8 is an example timing diagram for signals shown in FIG. 7 during a memory operation, according to an embodiment of the invention.

FIG. 8 is an example timing diagram for signals shown in FIG. 7, during a memory operation, according to an embodiment of the invention. The following description with reference to FIG. 7 and FIG. 8 assumes that memory cell 303 at the cross point of row 314 and column 324 (FIG. 7) is a selected memory cell. The waveforms of the signals in FIG. 8 can be similar to those of FIG. 4, except for the waveforms of signals RS1, RS2, RS3, RD4, RS4, R4 and DSR in FIG. 8.

In FIG. 8, a time interval between times T3 and T4 in FIG. 8 can be a time interval where the selected memory cell (one of memory cells 303 in FIG. 7) is accessed. Memory device 700 can be configured to provide signals CD4, CS4, C4, and DSC with voltages similar to those described above with reference to FIG. 3 and FIG. 4. For example, between times T3 and T4, signal C4 associated with selected line 374 (e.g., selected column access line) can be provided with voltage V6.

Between times T3 and T4, signal R4 associated with selected line 354 (e.g., selected row access line) can be provided with a voltage V10. Memory device 700 can be configured to provide voltage V10 with a voltage value, such that the voltage difference between voltages V6 and V10 (e.g., V6–V10) can turn on access component 304 of the of the selected memory cell.

Voltages V10 and V6 can have the same polarity or opposite polarities. For example, voltage V10 can have a negative value and voltage V6 can have a positive value. As shown in FIG. 4, voltages V10 and V6 can have example values of −5 (minus five) and five volts, respectively. Thus, in this example, the voltage difference between signals C4 and R4 is V10−V6=−5−(5)=−10 volts. Access component 304 can be configured to turn on with this voltage difference V10−V6 (e.g., −10 volts).

Between times T3 and T4 in FIG. 8, voltage V10 of signal R4 can be based on voltage V10 of signal DSR. Providing voltage V10 to signal R4 (between times T3 and T4) can include several activities. For example, between times T2 and T3, memory device 700 can turn on transistor 364 to couple line 354 to signal RD4 in order to cause signal R4 on line 354 to have voltage V9 based on voltage V9 provided to signal RD4. Switch 544 can be turned on between times T2 and T3. Memory device 700 can be configured to provide voltage V9 with a voltage value, such that a voltage difference between voltages V9 and V10 (e.g., V9−V10) can exceed the threshold voltage of switch 544 between times T2 and T3 to turn on switch 544. Memory device 700 can turn off transistor 364 (e.g., between times T3 and T4) to decouple line 354 from signal RD4 when switch 544 turns on. Thus, between times T3 and T4, line 354 is coupled to line 549 (associated with signal DSR). Therefore, as shown in FIG. 8, between times T3 and T4, signal R4 can be provided with voltage V10, which is based on voltage V10 provided to signal DSR.

Memory device 700 can provide different voltages (e.g., V0 and V7) to signal RS4 during different time intervals between times T1 and T4 in order to turn on or off transistor 364 during an access stage (e.g., between times T1 and T4) of the above example memory operation. For example, as shown in FIG. 8, signal RS4 can be provided with voltage V0 between times T1 and T2 and between times T3 and T4 and voltage V7 between times T2 and T3. Memory device 700 can be configured to provide voltage V7 to signal RS4 with a voltage value to turn on transistor 364. For example, voltage V7 can have a value of approximately three volts when voltage V9 has value of approximately two volts.

In the memory device (e.g., memory device 100, 200, 300, 500, or 700) described above with reference to FIG. 1 through FIG. 8, some components of the memory device can be structured with a relatively smaller size (e.g., smaller footprint). This can allow more area for other components (e.g., memory cells) of the memory device. Thus, memory cell density of the memory device for a given device size (e.g., die size) can be increased. For example, some or all of transistors (e.g., transistors 361, 362, 363, 364, 381, 382, 383, and 384) of select circuit 306 or 307, or both, in FIG. 3, FIG. 5, and FIG. 7 can be structured with a relatively smaller size. This can be achieved, in part, because switching circuits 340 and 540 can be included in the memory device to assist transistors of select circuit 306 or 307, or both, in driving signals (e.g., voltage, current, or both) to lines (e.g., access lines) in the memory array of the memory device.

Figure 9:
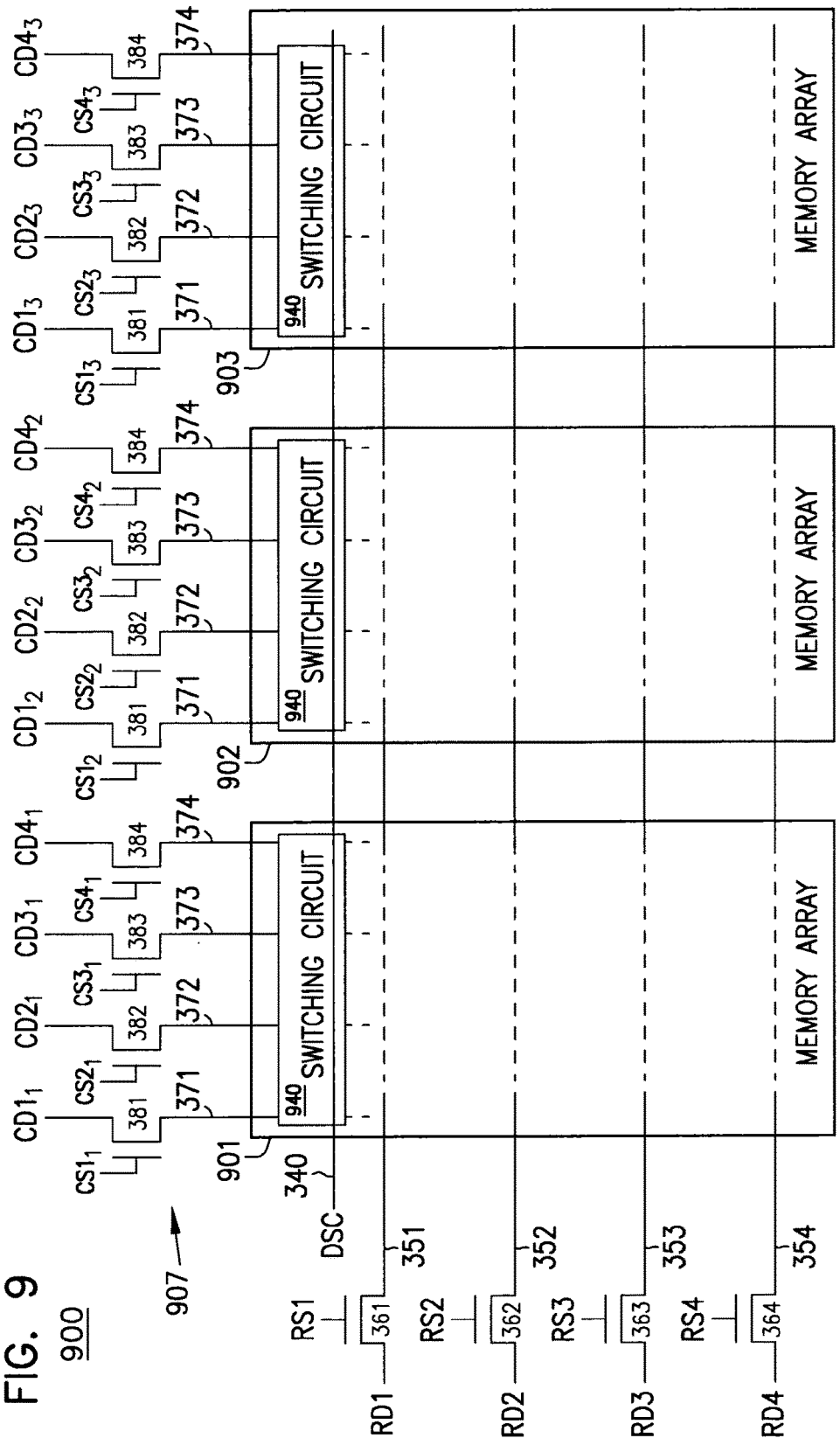
FIG. 9 shows a schematic diagram of a portion of a memory device including multiple memory arrays, according to an embodiment of the invention.

FIG. 9 shows a schematic diagram of a portion of a memory device 900 including multiple memory arrays 901, 902, and 903, according to an embodiment of the invention. Memory device 900 can include elements similar to or identical to those of memory array 302 of FIG. 3, such as lines (e.g., row access lines) 351, 352, 353, and 354, transistors 361, 362, 363, and 364, and signals DSC, RD1, RD2, RD3, RD4, RS1, RS2, RS3, and RS4. Each of memory arrays 901, 902, and 903 can include elements similar to or identical to those of memory array 302 of FIG. 3. Such elements are not shown in FIG. 9 for simplicity. FIG. 9 shows an example where memory device 900 can have three memory arrays 901, 902, and 903. The number of memory arrays can vary.

As shown in FIG. 9, memory arrays 901, 902, and 903 can be coupled to the same lines 351, 352, 353, and 354 and same transistors 361, 362, 363, and 364. Each of memory arrays 901, 902, and 903 can include a switching circuit 940. Switching circuit 940 can include elements similar to or identical to those of switching circuit 340 of FIG. 3 and can be configured to operate similarly to or identically to switching circuit 340 of FIG. 3.

In FIG. 9, memory device 900 can be configured to apply voltages to lines 351, 352, 353, and 354 through transistors 361, 362, 363, and 364, respectively, during a memory operation to access a selected memory cell in one of memory arrays 901, 902, and 903.

Memory device 900 can include a select circuit 907 having different groups (e.g., three groups) of transistors 381, 382, 383, and 384. Each group of transistors 381, 382, 383, and 384 can be configured to apply voltages to one of corresponding groups (e.g., three groups) of lines 371, 372, 373, and 374. The voltages applied to the groups of lines 371, 372, 373, and 374 can have different values to selectively access a selected memory cell in one of memory arrays 901, 902, and 903. Such voltages can be in the form of signals, such as signals $CD1_1$, $CD2_1$, $CD3_1$, $CD4_1$, $CD1_2$, $CD2_2$, $CD3_2$, $CD4_2$, $CD1_3$, $CD2_3$, $CD3_3$, and $CD4_3$.

Transistors 381, 382, 383, and 384 in the same group and in different groups can be configured to turn on or off based on a different signal, such as one of different signals $CS1_1$, $CS2_1$, $CS3_1$, $CS4_1$, $CS1_2$, $CS2_2$, $CS3_2$, $CS4_2$, $CS1_3$, $CS2_3$, $CS3_3$, and $CS4_3$. Each of transistors 381, 382, 383, and 384 in the groups can be configured to couple a corresponding line (e.g., one of lines 371, 372, 373, and 374) to one of signals $CD1_1$, $CD2_1$, $CD3_1$, $CD4_1$, $CD1_2$, $CD2_2$, $CD3_2$, $CD4_2$, $CD1_3$, $CD2_3$, $CD3_3$, and $CD4_3$.

Memory device 900 can be configured to access a selected memory cell in one of memory arrays 901, 902, and 903 in a fashion similar to that of memory device 300 of FIG. 3. For example, if a memory cell (not shown in FIG. 9) at the cross point of line 374 in memory array 903 and line 354 is a selected memory cell in a memory operation (e.g., a read or write operation), line 374 coupled to memory array 903 and line 354 can be referred to as selected lines. In this example, signals DSC, RD4, $CD4_3$, and $CS4_3$ can be provided with voltages similar to signals DSC, RD4, CD4, and CS4 described above with reference to FIG. 3 and FIG. 4. This allows the selected memory cell in memory array 903 to be accessed.

In the example above with reference to FIG. 9, unselected memory cells in memory arrays 901, 902, and 903 are not accessed. Signals RD1, RD2, and RD3 in FIG. 9 in the example can be provided with voltages similar to signals RD1, RD2, and RD3 described above with reference to FIG. 3 and FIG. 4. Each of signals $CD1_1$, $CD2_1$, $CD3_1$, $CD4_1$, $CD1_2$, $CD2_2$, $CD3_2$, $CD4_2$, $CD1_3$, $CD2_3$, and $CD3_3$ in FIG. 9 in the example can be provided with a voltage (e.g., V0 in FIG. 4) similar to that of signal CD1, CD2, or CD3 of FIG. 4. Each of signals $CS1_1$, $CS2_1$, $CS3_1$, $CS4_1$, $CS1_2$, $CS2_2$, $CS3_2$, $CS4_2$, $CS1_3$, $CS2_3$, and $CS3_3$ in FIG. 9 in this example can be provided with a voltage (e.g., V5 in FIG. 4) similar to that of signal CS1, CS2, or CS3 of FIG. 4.

FIG. 9 shows an example where memory device 900 can have three memory arrays 901, 902, and 903. The number of memory arrays can vary.

FIG. 9 shows an example where each of memory arrays 901, 902, and 903 includes one switching circuit (e.g., switching circuit 940) coupled to a corresponding set of lines (e.g., column access lines) 371, 372, 373, and 374, as an example. Alternatively, each of memory arrays 901, 902, and 903 can include an additional switching circuit (e.g., switching circuit 540 in FIG. 5) coupled to lines 351, 352, 353, and 354 (e.g., row access lines).

Figure 10:
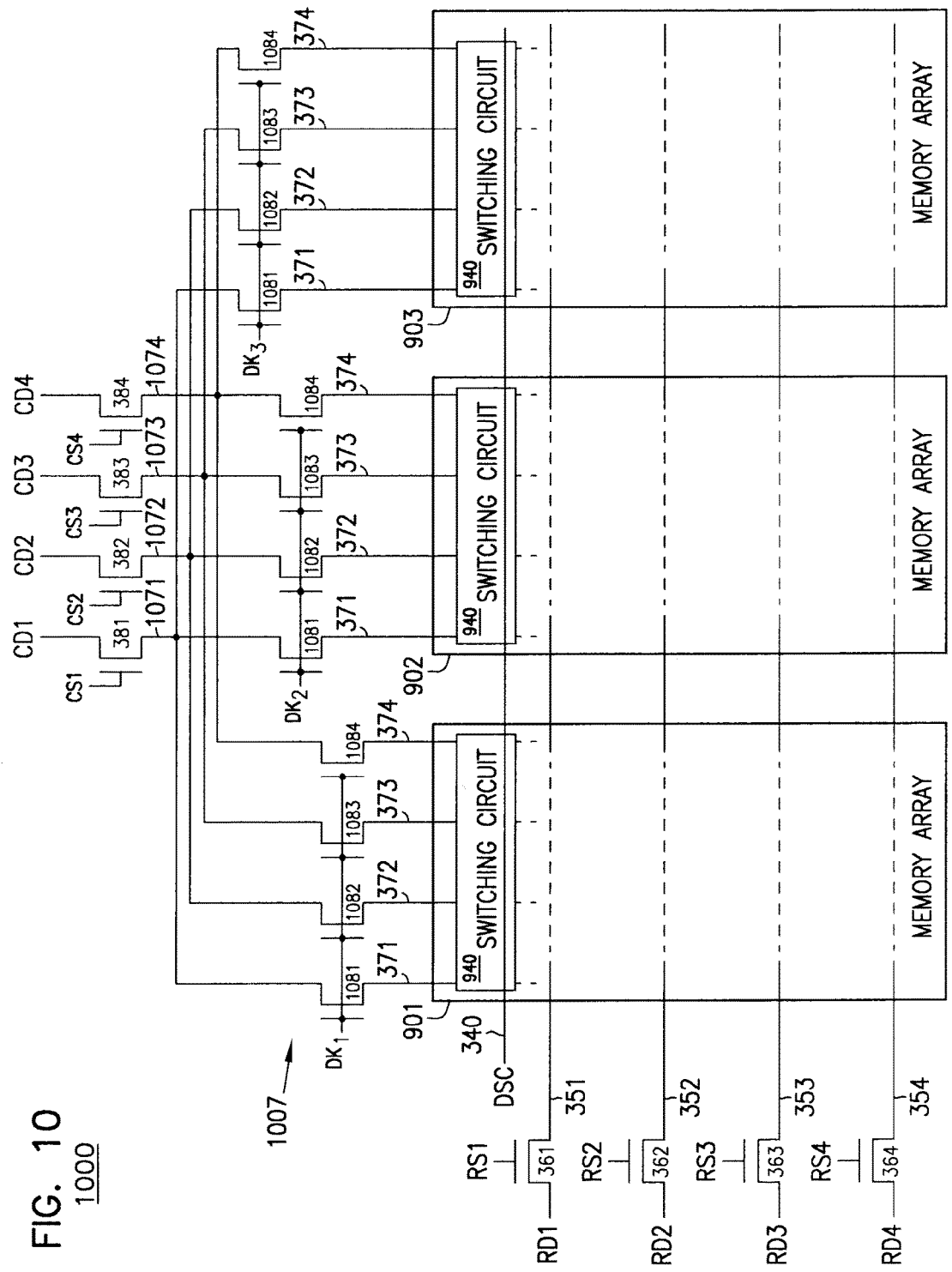
FIG. 10 shows a schematic diagram of a portion of a memory device including a select circuit shared by multiple memory arrays, according to an embodiment of the invention.

FIG. 10 shows a schematic diagram of a portion of a memory device 1000 including multiple memory arrays 901, 902, and 903 and a select circuit 1007 shared by memory arrays 901, 902, and 903, according to an embodiment of the invention. Memory device 1000 can include elements similar to or identical to those of memory device 300 of FIG. 3 and memory device 900 of FIG. 9. Such elements are given the same designation labels. For simplicity, detailed description of similar or identical elements among FIG. 3, FIG. 9, and FIG. 10 is not repeated in the description of FIG. 10.

Memory device 1000 can include a select circuit 1007 having different groups (e.g., three groups) of transistors 1081, 1082, 1083, and 1084 and different groups (e.g., three groups) of lines 371, 372, 373, and 374. Each group of transistors 1081, 1082, 1083, and 1084 can be configured to couple lines 1071, 1072, 1073, and 1074 to a corresponding group of lines 371, 372, 373, and 374. In memory operation, transistors 381, 382, 383, and 384 can turn on to couple lines 1071, 1072, 1073, and 1074 to signals CD1, CD2, CD3, and CD4, respectively. Then, signals CD1, CD2, CD3, and CD4 from lines 1071, 1072, 1073, and 1074 can be applied to lines 371, 372, 373, and 374, respectively, in of one memory arrays 901, 902, and 903.

In FIG. 10, transistors 1081, 1082, 1083, and 1084 within the same group can be configured to turn on or off based on the same signal, such as one of signals $DK_1$, $DK_2$, and $DK_3$. During a memory operation, depending on which of memory arrays 901, 902, and 903 is a selected memory array to access a selected memory cell in the selected memory array, one of signals $DK_1$, $DK_2$, and $DK_3$ can be provided with a voltage to turn on transistors 1081, 1082, 1083, and 1084 associated with the selected memory array (one of memory arrays 901, 902, and 903). For example, if memory array 903 is selected to access a selected memory cell in memory array 903, then signal $DK_3$ can be provided with a voltage to turn on transistors 1081, 1082, 1083, and 1084 associated with memory array 903. When turned on, transistors 1081, 1082, 1083, and 1084 associated with memory array 903 can couple lines 371, 372, 373, 374 in memory array 903 to lines 1071, 1072, 1073, and 1074. In this example, signals $DK_2$ and $DK_3$ can be provided with a voltage (e.g., V0 in FIG. 4) to turn off the groups of transistors 1081, 1082, 1083, and 1084 coupled to memory arrays 901 and 902 (e.g., unselected memory arrays). Thus, signals CD1, CD2, CD3, and CD4 are not provided to lines 371, 372, 373, 374 in memory array 901 and lines 371, 372, 373, 374 in memory array 902.

In a memory operation to access a selected memory cell in memory arrays 901, 902, and 903, memory device 1000 can provide voltages to signals DSC, CD1, CD2, CD3, CD4, CS1, CS2, CS3, CS4, RD1, RD2, RD3, RD4, RS1, RS2, RS3, and RS4 with values similar to or identical to those described above with reference to FIG. 3 and FIG. 4.

Figure 11:
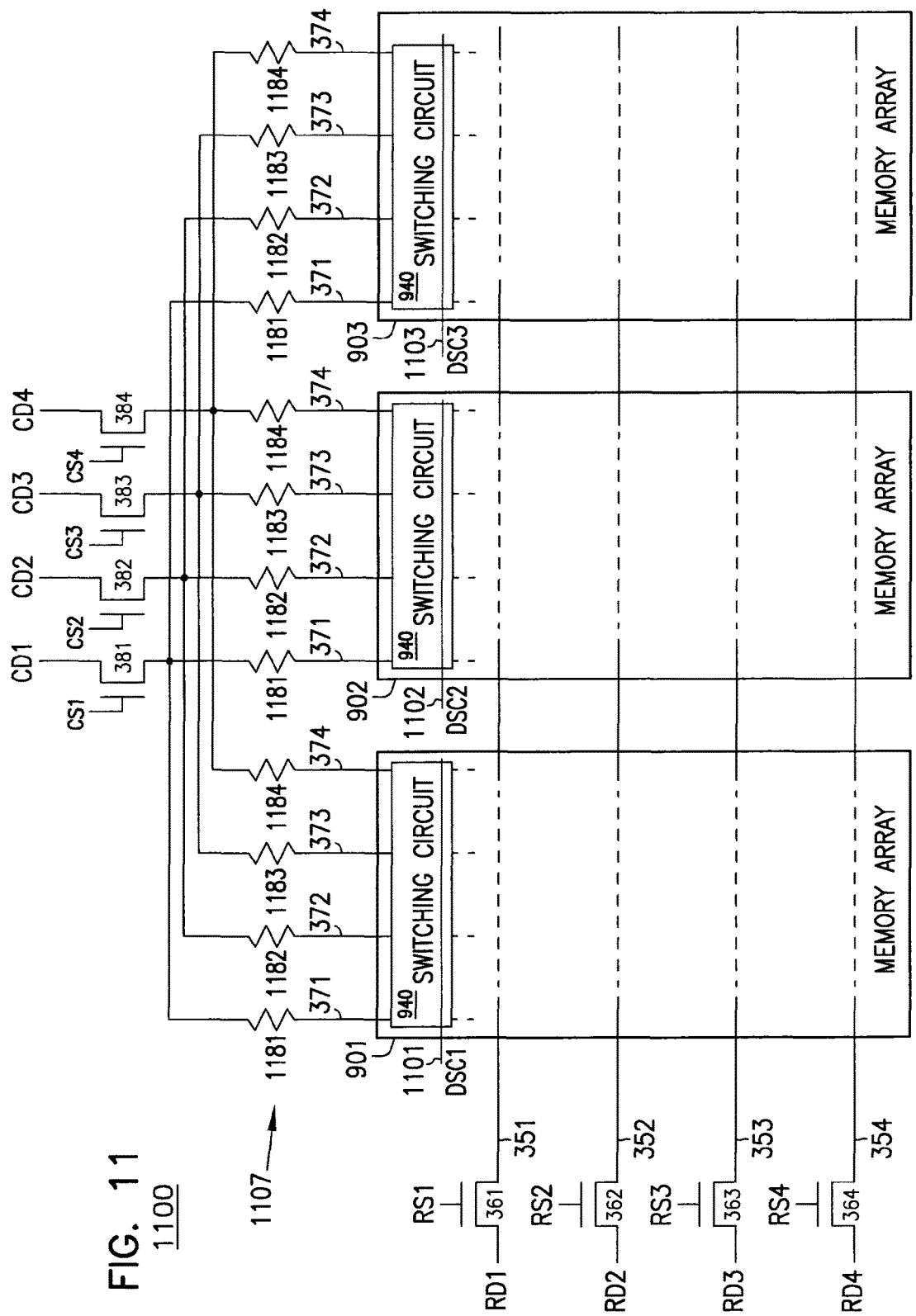
FIG. 11 shows a schematic diagram of a portion of a memory device including multiple memory arrays and a select circuit having resistors, according to an embodiment of the invention.

FIG. 11 shows a schematic diagram of a portion of a memory device 1100 including multiple memory arrays 901, 902, and 903 and a select circuit 1107 having resistors 1181, 1182, 1183, and 1184, according to an embodiment of the invention. Memory device 1100 can include elements similar to or identical to those of memory device 300 of FIG. 3, memory device 900 of FIG. 9, and memory device 1000 of FIG. 10. Such elements are given the same designation labels. For simplicity, detailed description of similar or identical elements among FIG. 3, FIG. 9, FIG. 10, and FIG. 11 is not repeated in the description of FIG. 11.

As shown in FIG. 10 and FIG. 11, three groups of resistors 1181, 1182, 1183, and 1184 in FIG. 11 can replace the corresponding three groups of transistors 1081, 1082, 1083, and 1084 in FIG. 10. A combination of separate lines 1101, 1102, and 1103 in FIG. 11 and their associated signals DSC1, DSC2, and DSC3 can replace line 340 and its associated signal DSC in FIG. 10.

In FIG. 11, each of resistors 1181, 1182, 1183, and 1184 can be structured as a two-terminal resistor. Each of resistors 1181, 1182, 1183, and 1184 can have a resistance value, such that each resistor can drive a signal (e.g., voltage or current signal) to a corresponding line 371, 372, 373, or 374 when a memory cell coupled to the corresponding line is a selected memory cell. Additionally, the resistance value of each of resistors 1181, 1182, 1183, and 1184 can be selected, such that each resistor can electrically isolate (in other words, does not drive) a signal to a corresponding line 371, 372, 373, or 374 when memory cells (not shown in FIG. 11) coupled to that corresponding line are unselected memory cells. As an example, each of resistors 1181, 1182, 1183, and 1184 can have a value in the range of kilo Ohms (KΩ). For example, each of resistors 1181, 1182, 1183, and 1184 can have a value of approximately 10 KΩ to 50 KΩ.

Resistors 1181, 1182, 1183, and 1184 can be located in (e.g., formed in or on) substrate of memory device 1100. An example of such a substrate can include substrate 1599 of FIG. 15. Alternatively, resistors 1181, 1182, 1183, and 1184 can be part of lines 371, 372, 373, and 374, respectively, or can be part of paths from lines 371, 372, 373, and 374 to a decoder (that can be similar to decoder 107 of FIG. 1) of memory device 1100. For example, resistors 1181, 1182, 1183, and 1184 can be realized as part of conductive lines (e.g., part of column access lines), such as conductive lines 1271, 1272, 1273, and 1274 of FIG. 12.

As shown in FIG. 11, each of memory arrays 901, 902, and 903 can include a corresponding line 1101, 1102, and 1103 that can carry a corresponding signal DSC1, DSC2, or DSC3. Memory device 1100 can be configured to provide different voltages to signals DSC1, DSC2, and DSC3, depending on which of memory arrays 901, 902, and 903 is a selected memory array to access a selected memory cell in the selected memory array. For example, in a memory operation, one of signals DSC1, DSC2, and DSC3 (e.g., signal DSC3) associated with a selected memory array (e.g., memory array 903) can be provided with a voltage (e.g., 5V) similar to that of signal DSC in FIG. 4. The other signals (e.g., DSC1 and DSC2) associated with non-selected memory arrays (e.g., memory arrays 901 and 902) can be provided with another voltage (e.g., zero volts), such that switches (e.g., 341, 342, 343, and 344) in switching circuit 940 of the non-selected memory arrays do not turn on.

For example, if a memory cell (not shown in FIG. 11) at the cross point of line 374 in memory array 903 and line 354 is a selected memory cell in a memory operation (e.g., a read or write operation), signal DSC3 can be provided with a voltage (e.g., 5V) similar to that of signal DSC in FIG. 4. Signals DSC1 and DSC2 can be provided with zero volts.

As described above with reference to FIG. 9, FIG. 10, and FIG. 11, each of memory arrays 901, 902, and 903 includes switching circuit 940 (e.g., a column switching circuit. Each of memory arrays 901, 902, and 903, however, can include a row switching circuit, such as switching circuit 540 of FIG. 5 or FIG. 7.

Figure 12:
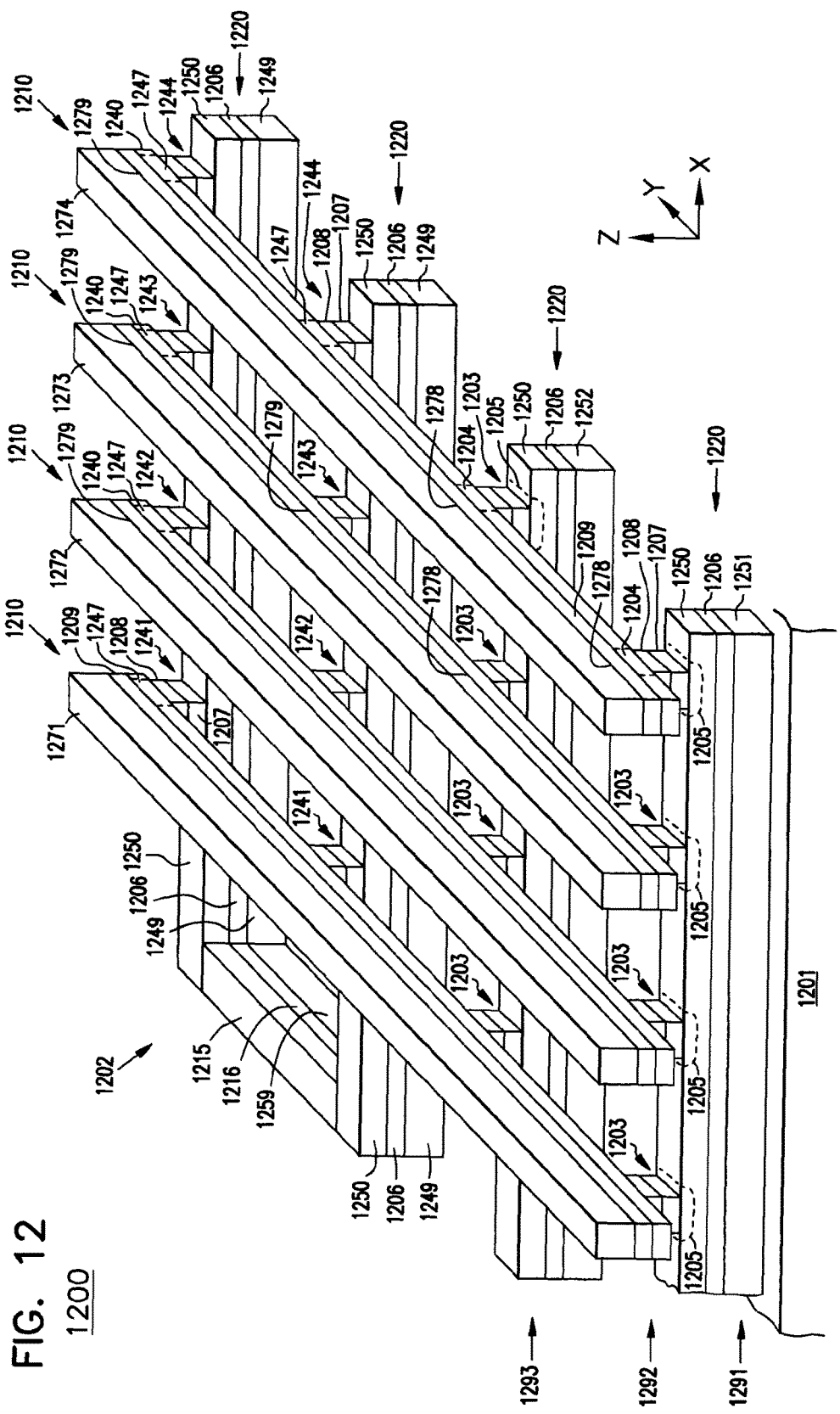
FIG. 12 shows a structure of a portion of a memory device, according to an embodiment of the invention.

FIG. 12 shows a structure of a portion of a memory device 1200, according to an embodiment of the invention. Memory device 1200 can include different device levels 1291, 1292, and 1293 in a z-direction. As shown in FIG. 12, device level 1292 can be between device levels 1291 and 1293. Memory device 1200 can include a memory array 1202 that can overlie a substrate (e.g., a semiconductor substrate) 1201. Memory device 1200 can be associated with memory device 300 of FIG. 3, such that the structure of memory array 1202 in FIG. 12 can form at least a portion of a structure of memory array 302 of FIG. 3. Memory device 1200 can also be associated with memory device 900, 1000, or 1100 of FIG. 9, FIG. 10, or FIG. 11, respectively, such that the structure of memory array 1202 in FIG. 12 can form at least a portion of a structure of one or more of memory arrays 901, 902, and 903 of FIG. 9, FIG. 10, and FIG. 11.

As shown in FIG. 12, memory array 1202 can include conductive lines 1249, 1251, and 1252 located in device level 1291 and extending (e.g., length-wise) in an x-direction. Memory array 1202 can include conductive lines 1271, 1272, 1273, and 1274 located in device level 1293 and extending (e.g., length-wise) in a y-direction. The x-direction and the y-direction can be perpendicular (or substantially perpendicular) to each other and to the z-direction. Conductive lines 1249, 1251, 1252, 1271, 1272, 1273, and 1274 can include conductive materials, such as single metal, an alloy of metals, other conductive materials. Example materials for conductive lines, such as lines 1249, 1251, 1252, 1271, 1272, 1273, and 1274, include Cu, W, Al, AlCu alloy, and AuAlCu alloy.

The structure of conductive lines 1249 can form an example structure for line 349 of FIG. 3. The structures of conductive lines 1251 and 1252 in FIG. 12 can form an example structure for two of lines 351, 352, 353, and 354 (e.g., lines 351 and 352) of FIG. 3. The structures of conductive lines 1271, 1272, 1273, and 1274 in FIG. 12 can form example structures for lines 371, 372, 373, and 374, respectively, of FIG. 3. Thus, the structures of conductive lines 1251 and 1252 and conductive lines 1271, 1272, 1273, and 1274 can form part of access lines of memory device 1200. For example, the structures of conductive lines 1251 and 1252 in can form part of row access lines of memory device 1200. The structures of conductive lines 1271, 1272, 1273, and 1274 in FIG. 12 can form of column access lines of memory device 1200.

Memory array 1202 can include device structures 1203, 1241, 1242, 1243, and 1244 located in device level 1292. Each of device structures 1203 can include at least a portion of each of materials 1240, 1250, 1206, 1207, 1208, and 1209 that are located at the cross point of one of conductive lines 1251 and 1252 and one of lines conductive lines 1271, 1272, 1273, and 1274. Each of device structures 1241, 1242, 1243, and 1244 can include at least a portion of each of materials 1240, 1250, 1206, 1207, 1208, and 1209 that are located at the cross point of one of conductive lines 1249 and one of lines conductive lines 1271, 1272, 1273, and 1274. Materials 1240 and 1250 can include materials similar to or identical to those of access component 304 and storage element 305, respectively, of FIG. 3. For example, materials 1240 and 1250 can include phase change materials (e.g., chalcogenides). Materials 1206, 1207, 1208, and 1209 can include conductive materials, such as a single metal, an alloy of metals, other conductive materials. Examples of these materials include Ti Ti—TiN, C, and CN.

FIG. 12 shows an example of conductive lines (e.g., 1249, 1251, 1252, 1271, 1272, 1273, and 1274) and device structures (e.g., 1203, 1241, 1242, 1243, and 1244) arrange in four rows 1220 and four columns 1210. The number of conductive lines and device structures can vary and can be arranged in different numbers of rows and columns.

Memory device 1200 can include a conductive segment 1259, a material 1215, and a material 1216. Conductive lines 1251 and 1252 can be electrically decoupled. Conductive lines 1249 can be short-circuited by conductive segment 1259. Therefore, lines 1249 can behave as one line from an electrical stand-point. Conductive segment 1259 can be located in the same device level 1291 as conductive lines 1249 and can be directly coupled to conductive lines 1249. In a different embodiment (not shown), conductive lines 1249 can be coupled to each other through a conductive segment, at least partially on device level different from device level 1291.

As shown in FIG. 12, material 1250 can overlie the length (e.g., length extending in the x-direction) of each of conductive lines 1249 in two of rows 1220. Material 1215 can be coupled (e.g., can direct contact) to material 1250 that overlies the length of each of conductive lines 1249 in two of rows 1220. Materials 1250 and 1215 can include the same material (e.g., the same phase change material).

Material 1206 can overlie material 1259 and overlie each of conductive lines 1249 in two of rows 1220. Material 1216 can be coupled (e.g., can direct contact) to material 1206 that overlies the length of each of conductive lines 1249 in two of rows 1220. Materials 1206 and 1216 can include the same material.

FIG. 12 shows an example of conductive segment 1259 and materials 1215 and 1216 coupled to corresponding conductive lines 1249, material 1250, and 1206 in two rows 1220. Conductive segment 1259, material 1215, and 1216 can be coupled to corresponding conductive lines 1249, material 1250, and 1206 in more than two rows.

Device structures 1203 can be configured to operate as memory cells, which can correspond to memory cells 303 of FIG. 3. For example, in FIG. 12, at least a portion (e.g., portion 1205) of material 1250 at each of device structures 1203 can be configured to store information. At least a portion (e.g., portion 1204) of material 1240 at each of device structures 1203 can be configured to operate as an access component, which can correspond to access component 304 of FIG. 3. At least a portion of each of materials 1206, 1207, 1208, and 1209 at each of device structures 1203 can be configured to operate as an electrode to provide signal through the memory cell. For simplicity, FIG. 12 shows a label for portion 1205 at only some of device structures 1203.

Device structures 1241, 1242, 1243, and 1244 are not configured to operate as memory cells. Thus, device structures 1241, 1242, 1243, and 1244 are not configured to store information. For example, no portion of material 1250 at each of device structures 1241, 1242, 1243, and 1244 is configured to store information.

Device structures 1241, 1242, 1243, and 1244 can be configured to operate as switches, which can correspond to switches 341, 342, 343, and 344 of FIG. 3. For example, in FIG. 12, at least a portion (e.g., portion 1247) of material 1240 at each of device structures 1241, 1242, 1243, and 1244 can be configured to operate as a switch (e.g., as an ovonic threshold switch). For simplicity, FIG. 12 shows a label for portion 1247 at only some of device structures 1241, 1242, 1243, and 1244.

As shown in FIG. 12, device structures 1203 and device structures 1241, 1242, 1243, and 1244 can directly contact conductive lines 1271, 1272, 1273, and 1274 at different contact locations (e.g., contact locations 1278 and 1279). Thus, each of the memory cells can be formed from device structures 1203 (e.g. at single contact locations 1278) and each of the switches can be formed from device structures 1241, 1242, 1243, and 1244 at different contact locations (e.g. multiple contact locations 1279 at the cross points of lines 1249 and each of lines 1271, 1272, 1273, and 1274). The total contact area at multiple contact locations 1279 of the switches at device structures 1241, 1242, 1243 and 1244 can be greater than a contact area at single contact location 1278 of memory cells at device structures 1203.

Memory device 1200 can be configured to decrease the current density through each contact location of the switches. Under normal operating conditions (e.g., when the switches are driven with the same current limitation) in a memory operation, material 1250 overlying conductive lines 1249 can remain in a conductive state (e.g., a crystalline state). This can allow portion 1247 of material 1240 at each of device structures 1241, 1242, 1243, and 1244 to operate as a switch, such as an ovonic threshold switch.

Figure 13:
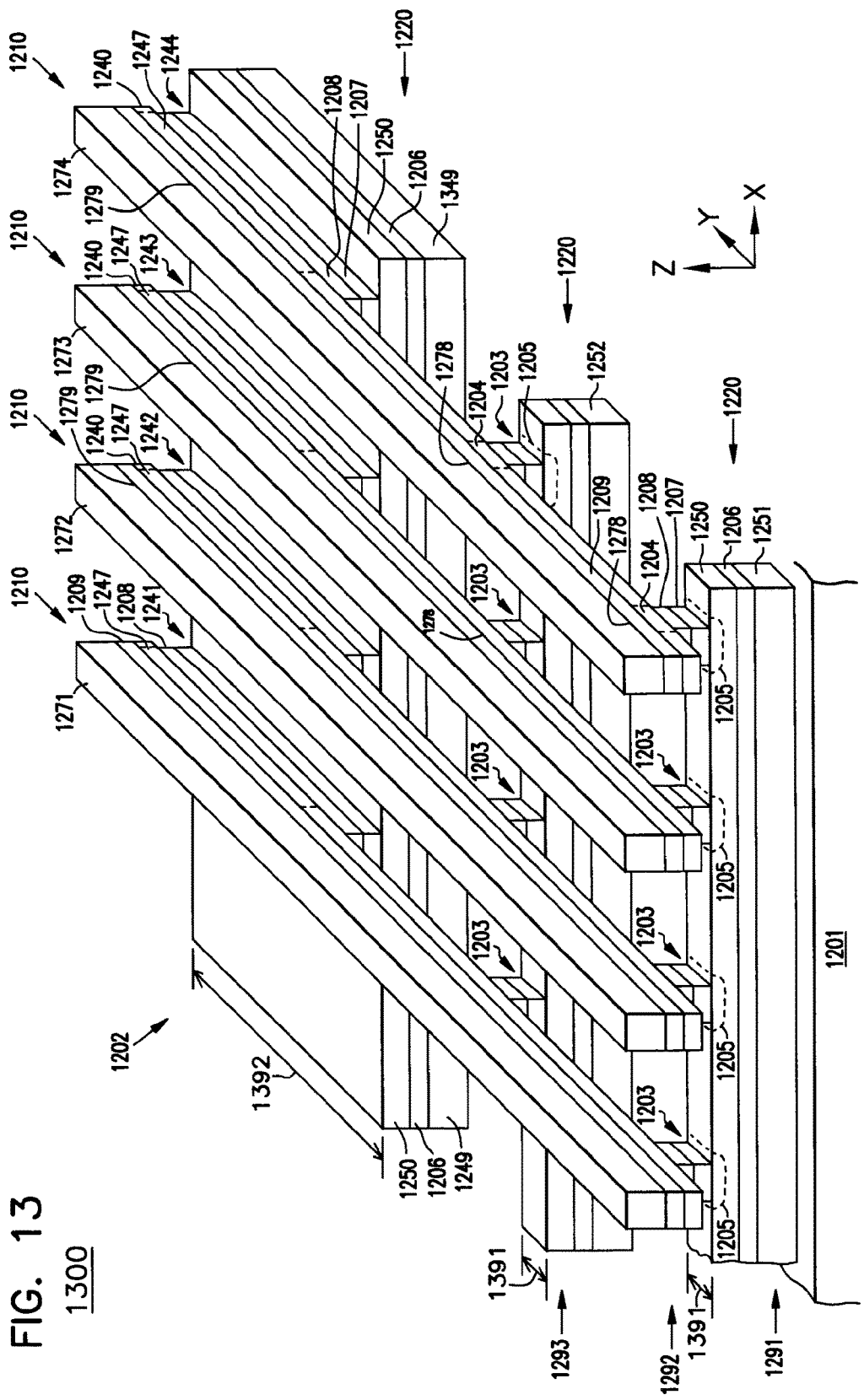
FIG. 13 shows a structure of a portion of a memory device including conductive lines having different widths, according to an embodiment of the invention.

FIG. 13 shows a structure of a portion of a memory device 1300 including conductive lines 1251 and 1349 having different widths, according to an embodiment of the invention. Memory device 1300 can include elements similar to or identical to those of memory device 1200 of FIG. 12. Such elements are given the same designation labels. For simplicity, detailed description of similar or identical elements between FIG. 12 and FIG. 13 is not repeated in the description of FIG. 13.

Memory device 1300 can be associated with memory device 300 of FIG. 3, such that the structure of memory array 1302 can form at least a portion of a structure of memory array 302 of FIG. 3. Memory device 1300 can also be associated with memory device 900, 1000, or 1100 of FIG. 9, FIG. 10, FIG. 11, respectively, such that the structure of memory array 1302 can form at least a portion of a structure of one or more of memory arrays 901, 902, and 903 of FIG. 9, FIG. 10, and FIG. 11.

As shown in FIG. 13, conductive line 1349 and materials 1250 and 1206 overlying conductive line 1349 have width 1392. Each of conductive lines 1251 and 1252 has a width 1391. Width 1392 can be greater than width 1391. Greater width can increase the area of material 1250 at the cross points of lines 1271, 1272, 1273, and 1274 and lines 1249, 1251, and 1252, relative to the area of material 1250 at the cross points of lines 1271, 1272, 1273, and 1274 and lines 1251, and 1252. Thus, under normal operating conditions in a memory operation, material 1250 overlying conductive line 1349 can remain in a conductive state (e.g., a crystalline state). This can allow portion 1247 of material 1240 at each of device structures 1241, 1242, 1243, and 1244 to operate as a switch, such as an ovonic threshold switch.

Figure 14:
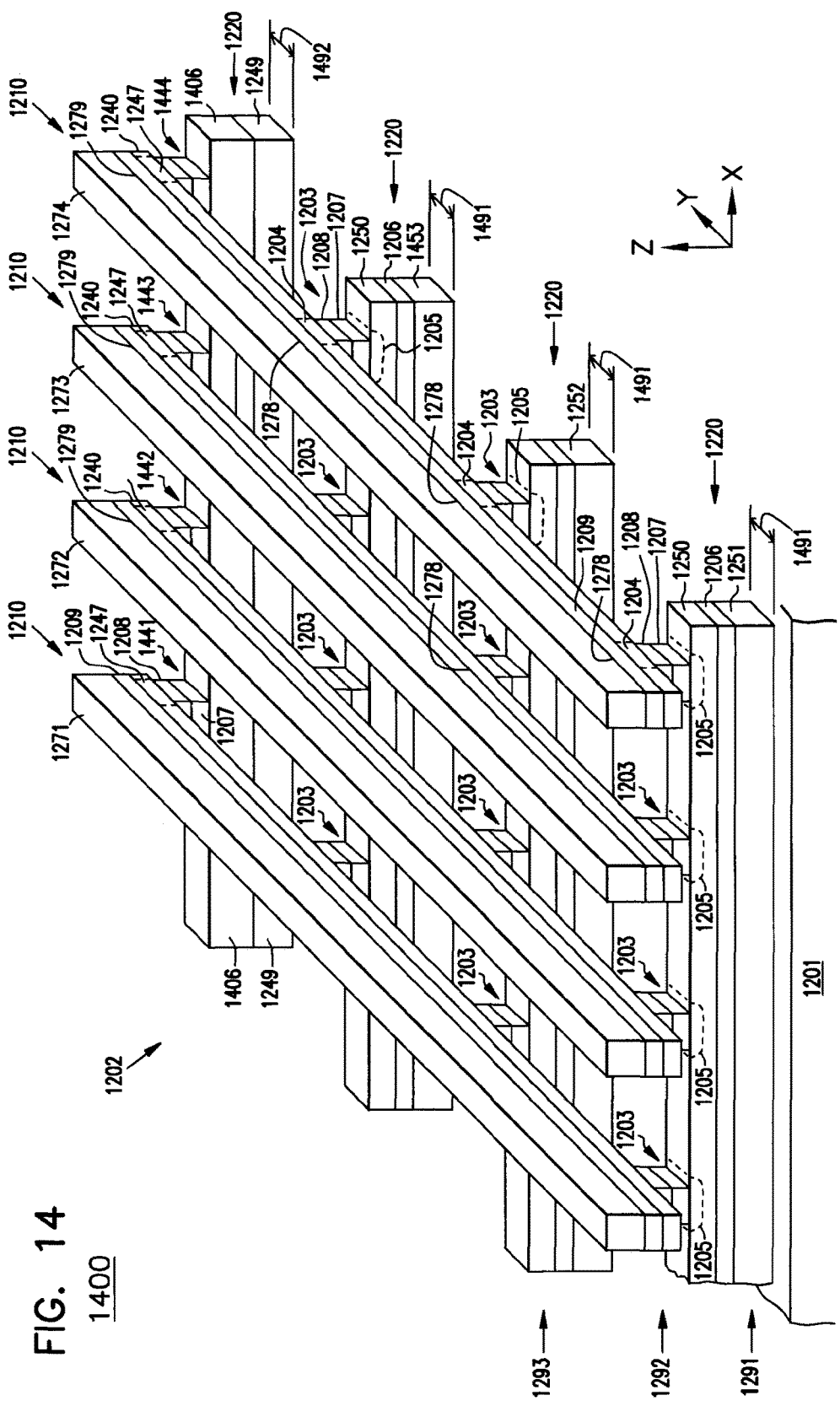
FIG. 14 shows another structure of a portion of a memory device, according to an embodiment of the invention.

FIG. 14 shows a structure of a portion of a memory device 1400, according to an embodiment of the invention. Memory device 1400 can include elements similar to or identical to those of memory device 1200 of FIG. 12. Such elements are given the same designation labels. For simplicity, detailed description of similar or identical elements between FIG. 12 and FIG. 14 is not repeated in the description of FIG. 14. For example, structures 1203 (configured to operate as memory cells) associated with conductive line 1453 in one of rows 1220 can be similar to structures 1203 associated with conductive lines 1251 and 1252 in two of rows 1220.

Memory device 1400 can be associated with memory device 300 of FIG. 3, such that the structure of memory array 1402 can form at least a portion of a structure of memory array 302 of FIG. 3. Memory device 1400 can also be associated with memory device 900, 1000, or 1100 of FIG. 9, FIG. 10, FIG. 11, respectively, such that the structure of memory array 1402 can form at least a portion of a structure of a structure of one or more of memory arrays 901, 902, and 903 of FIG. 9, FIG. 10, and FIG. 11.

In FIG. 14, memory device 1400 can include device structures 1441, 1442, 1443, and 1444, each of which can include a portion of each of materials 1240, 1207, 1208, 1209, and 1406. Material 1406 can be similar to or identical to material 1206 (e.g., conductive material) described above with reference to FIG. 12. In comparing FIG. 14 with FIG. 12, material 1250 (e.g., phase change material) in FIG. 12 can be excluded from device structures 1441, 1442, 1443, and 1444 of memory device 1400 in FIG. 14.

As shown in FIG. 14, conductive line 1249 can include a width 1492. Each of conductive lines 1251, 1252, and 1453 can include a width 1491. Width 1492 can be greater than width 1491.

In an example process of forming device structures 1441, 1442, 1443, and 1444 in FIG. 14, material 1250 can be initially (e.g., before material 1406 is formed) included in device structures 1441, 1442, 1443, and 1444. For example, material 1250 can be initially formed (e.g., deposited) in device structures 1203 (as shown in FIG. 14) and in device structures 1441, 1442, 1443, and 1444 (not shown in FIG. 14) at the same time (e.g., in the same processing step using the same material). Then, material 1250 can be removed from structures 1441, 1442, 1443, and 1444 while material 1250 can be left in device structures 1203, as shown in FIG. 14. In the example process, a mask (e.g., a photoresist) can be configured (e.g., patterned) in order to mask a portion of device 1400 at the area where device structures 1203 are located. Such a mask can also be configured to expose the area where device structures 1441, 1442, 1443, and 1444 are located. The example process can remove a portion of material 1250 at the exposed area. Then, material 1406 can be formed.

In another example process of forming device structures 1441, 1442, 1443, and 1444 in FIG. 14, material 1250 can be formed in memory device 1400 at only the area where device structures 1203 are located. Material 1250 is not formed in memory device 1400 at the area where device structures 1441, 1442, 1443, and 1444 are located. Thus, this example process can omit a step of removing a portion of material 1250 from the area where device structures 1203 are located.

In FIG. 14, device structures 1441, 1442, 1443, and 1444 can be configured to operate as switches, which can correspond to switches 341, 342, 343, and 344 of FIG. 3. At each of device structures 1441, 1442, 1443, and 1444, a portion of material 1209 can be configured to operate as an electrode (e.g., top electrode) of a switch and a combination of a portion of each of materials 1207, 1208, and 1406 can be configured to operate as another electrode (e.g., bottom electrode of the switch). As shown in FIG. 14, the combination of a portion of each of materials 1207, 1208, and 1406 (that can form an electrode) can directly contact material 1240 and a portion of conductive line 1249.

The description above with reference to FIG. 3 through FIG. 14 shows the switching circuits being located at a border (e.g., an edge) of the memory array as an example. The locations of the switching circuits can be located in other locations of the memory array.

Figure 15:
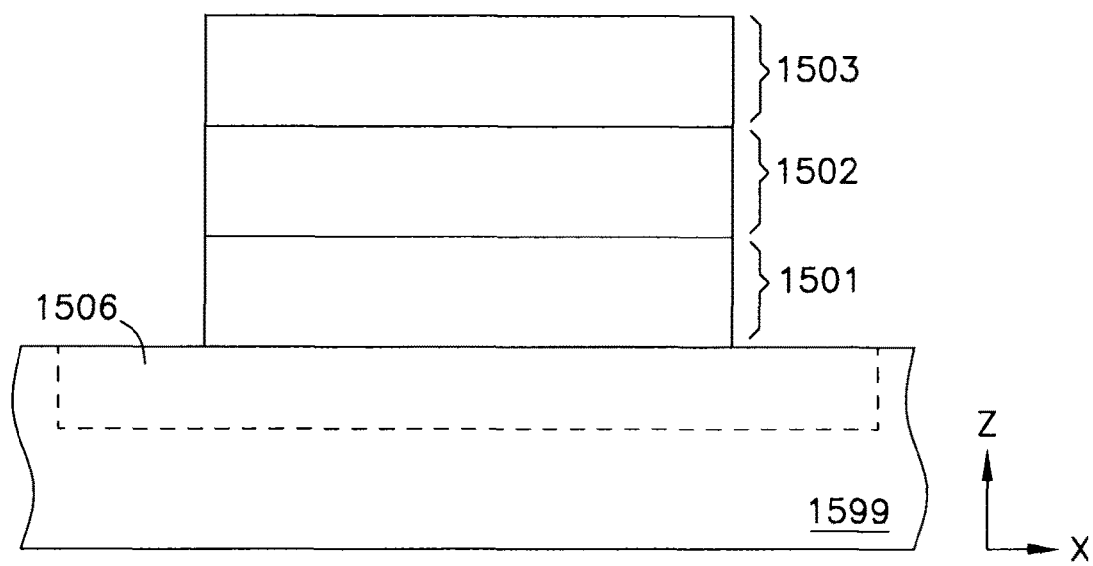
FIG. 15 shows a structure of a portion of a memory device including multiple memory arrays arranged in a stack, according to an embodiment of the invention.

FIG. 15 shows a structure of a portion of a memory device 1500 including multiple memory arrays 1501, 1502, and 1503 arranged in a stack, according to an embodiment of the invention. Each of memory arrays 1501, 1502, and 1503 can include the structure of memory array 1202, 1302, or 1402 of FIG. 12, FIG. 13, or FIG. 14. FIG. 15 shows three memory arrays 1501, 1502, and 1503 as an example. The number of memory arrays in the stack can vary.

Memory device 1500 can include a substrate (e.g., a semiconductor substrate) 1599. As shown in FIG. 15, memory arrays 1501, 1502, and 1503 can overlie each other and can be arranged in a stack over substrate 1599. For example, memory array 1501 can overlie substrate 1599. Memory array 1502 can overlie memory array 1501. Memory array 1503 can overlie memory array 1502.

Substrate 1599 can include a substrate portion 1506 where other parts of memory device 1500 can be located. For example, memory device 1500 can include select circuits (not shown in FIG. 15) that can include transistors, such as transistors 361, 362, 363, 364, 381, 382, 383, and 384 in FIG. 3, FIG. 9, FIG. 10, and FIG. 11. Such transistors of the selected circuits of memory device 1500 can be located in (e.g., formed in or on) substrate portion 1506. In another example, memory device 1500 can select circuits (not shown in FIG. 15) that can include resistors, such as resistors 1181, 1182, 1183, and 1184 in FIG. 11. Such resistors of memory device 1500 can be located in (e.g., formed in or on) substrate portion 1506.

Memory device 1500 can be associated with memory device 900 (FIG. 9), memory device 1000 (FIG. 10), or memory device 1100 (FIG. 11), such that memory arrays 1501, 1502, and 1503 can form at least a portion of memory arrays 901, 902, and 903, respectively, of FIG. 9, FIG. 10, or FIG. 11.

Figure 16:
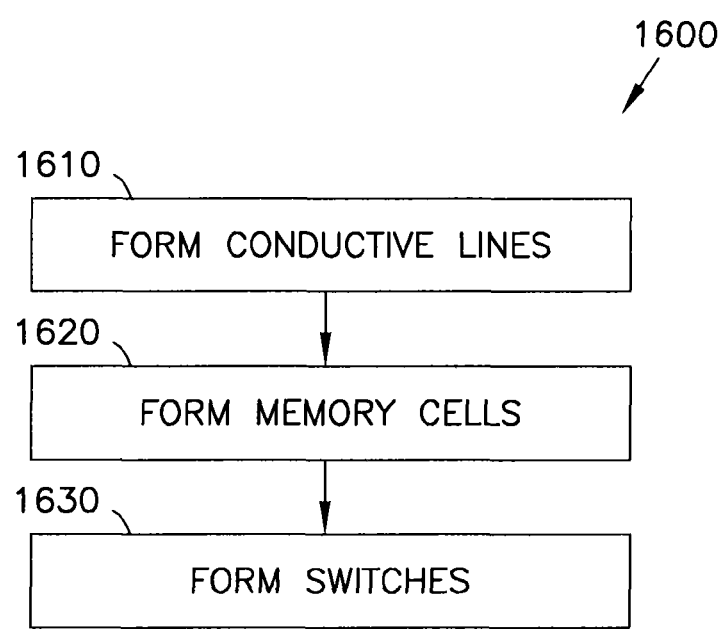
FIG. 16 is a flowchart showing a method, according to an embodiment of the invention.

FIG. 16 is a flow chart showing a method 1600, according to an embodiment of the invention. Method 1600 can form a memory device such as memory device 300, 500, 700, 900, 1000, 1100, 1200, 1300, 1400, and 1500 described above with reference to FIG. 3 through FIG. 15. Method 1600 can include activities 1610, 1620, and 1630.

Activity 1610 can include forming conductive lines. The conductive lines can be formed such that one group of the conductive lines can extend in one direction (e.g., x-direction), and another group of the conductive lines can extend in another direction (e.g., y-direction). The conductive lines can be formed such that one group of the conductive lines can pass over another group of the conductive lines at a number of cross points. The conductive lines formed in activity 1610 can include conductive lines 351, 352, 353, and 354 and conductive lines 371, 372, 373, and 374 of FIG. 3, FIG. 5, FIG. 7, FIG. 9, FIG. 10, and FIG. 11. The conductive lines formed in activity 1610 can also include conductive lines 1249, 1349, 1251, and 1252 and conductive lines 1271, 1272, 1273, and 1274 of FIG. 12, FIG. 13, and FIG. 14.

Forming the conductive lines in activity 1610 can include forming one of the conductive lines with a width such that the width can be greater than the width of at least one of the other conductive lines. For example, activity 1610 can form conductive lines 1349, 1251 and 1252 of FIG. 13.

Activity 1620 can include forming memory cells. Forming the memory cells in activity 1620 can include forming device structures at some of the cross points, such that each of the device structures can include one of the memory cells. For example, activity 1620 can form device structures 1203 of FIG. 12, FIG. 13, and FIG. 14, in which each of the device structures 1203 can include a memory cell.

Activity 1630 can include forming switches in the memory device. The switches (in activity 1630) and the memory cells (in activity 1620) can be formed, such that the switches can be located at one group of the cross points and the memory cells can be located at another group of the cross points. Forming the switches in activity 1630 can include forming device structures at some of the cross points, such that each of the device structures can include one of the switches. For example, activity 1630 can form device structures 1241, 1242, 1243, and 1244 of FIG. 12 and FIG. 13, or device structures 1441, 1442, 1443, and 1444 of FIG. 14.

The individual activities of method 1600 do not have to be performed in the order shown or in any particular order. Some activities may be repeated, and others may occur only once. Method 1600 can have more or fewer activities than those shown in FIG. 6. For example, method 1600 can include the process of forming device structures 1203, 1241, 1242, 1243, 1244, 1441, 1442, 1443, and 1444 described above with reference to FIG. 12, FIG. 13, and FIG. 14.

The illustrations of apparatuses (e.g., memory devices 100, 200, 300, 500, 700, 900, 1000, 1100, 1200, 1300, 1400, and 1500) and methods (e.g., operating methods associated with the memory devices described herein and method 1600) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, 300, 500, 700, 900, 1000, 1100, 1200, 1300, 1400, and 1500) or a system (e.g., a computer, a cellular phone, or other electronic system) that includes a device such as memory devices 100, 200, 300, 500, 700, 900, 1000, 1100, 1200, 1300, 1400, and 1500.

Any of the components described above with reference to FIG. 1 through FIG. 16 can be implemented in a number of ways, including simulation via software. Thus, apparatuses (e.g., memory devices 100, 200, 300, 500, 700, 900, 1000, 1100, 1200, 1300, 1400, and 1500) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300, 500, 700, 900, 1000, 1100, 1200, 1300, 1400, and 1500 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

The embodiments described above with reference to FIG. 1 through FIG. 16 include apparatuses and methods having a memory cell, first and second conductive lines configured to access the memory cell, and a switch configured to apply a signal to one of the first and second conductive lines. In at least one of such embodiments, the switch can include a phase change material. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a first group of conductive lines;
    a second group of conductive lines;
    memory cells, each of the memory cells located between a conductive line in the first group of conductive lines and a conductive line in the second groups of conductive lines; and
    switches, each of the switches located between a conductive line in the first group of conductive lines and a conductive line in the second groups of conductive lines, wherein each of the switches includes a phase change material.

2. The apparatus of claim 1, further comprising:
    a conductive segment coupled to a first conductive line in the first group of conductive lines and coupled to a second conductive line in the first group of conductive lines.

3. The apparatus of claim 1, wherein the first group of conductive lines include:
    a first conductive line having a first width; and
    a second conductive line having a second width, and the first width being greater than the second width.

4. The apparatus of claim 1, wherein each of the switches includes:
    a first electrode contacting a first conductive line in the first group conductive lines;
    a second electrode contacting a conductive line of the second group conductive lines; and
    the phase change material of a respective switch of the switches contacts the first and second electrodes of the respective switch.

5. An apparatus comprising:
    a first group of conductive lines, each conductive line in the first group of conductive lines including a length in a first direction and a width in a second direction, the width of a first conductive line in the first group of conductive lines being greater than the width of each of second conductive lines in the first group of conductive lines;
    a second group of conductive lines, each conductive line in the second group of conductive lines including a length in the second direction, the second group of conductive lines passing over the first group of conductive lines at cross points; and
    memory cells, each of the memory cells located between respective cross point of the cross points.

6. The apparatus of claim 5, wherein each of the memory cells includes a phase change material.

7. The apparatus of claim 5, further comprising:
    switches located at respective cross points of the first conductive line in the first group of conductive lines and the second group of conductive lines.

8. The apparatus of claim 7, wherein each of the switches includes an electrode contacting the first conductive line in the first group conductive lines.

9. The apparatus of claim 8, wherein each of the switches includes an additional electrode contacting a respective conductive line of the second group of conductive lines.

10. The apparatus of claim 9, further comprising:
    a phase change material between the electrode and the additional electrode of each of the switches.

11. An apparatus comprising:
    a first group of conductive lines, each conductive line in the first group of conductive lines including a length in a first direction;
    a second group of conductive lines, each conductive line in the second group of conductive lines including a length in a second direction, the second group of conductive lines passing over a first conductive line in the first group of conductive lines at first cross points and passing over second conductive lines in the first group of conductive lines at second cross points;
    switches located at the first cross points, each of the switches including a phase change material; and
    phase change memory cells, each of the phase change memory cells located at respective cross point of the second cross points.

12. The apparatus of claim 11, wherein each of the switches includes an electrode contacting the first conductive line in the first group conductive lines.

13. The apparatus of claim 12, wherein each of the switches includes an additional electrode contacting a respective conductive line of the second group of conductive lines.

14. The apparatus of claim 13, wherein the phase change material of a respective switch of the switches contacts the first electrode of the respective switch and the additional electrode of the respective switch.

15. The apparatus of claim 14, wherein each of the switches includes an additional phase change material contacting the second electrode, and a second additional electrode between the phase change material and the additional phase change material.

16. The apparatus of claim 11, wherein each of the phase change memory cells includes a first electrode contacting a respective conductive line of the second conductive lines in the first group of conductive lines.

17. The apparatus of claim 16, wherein each of the phase change memory cells includes a second electrode contacting a respective conductive line of the second group of conductive lines.

18. The apparatus of claim 17, wherein the phase change memory cells include a first phase change material contacting the first electrode.

19. The apparatus of claim 18, wherein the phase change memory cells include a second phase change material contacting the second electrode, and a third electrode between the first and second phase change materials.

20. The apparatus of claim 19, wherein the phase change memory cells include a fourth electrode between the second phase change material and the third electrode.

\* \* \* \* \*